(12) United States Patent
Hikita et al.

(10) Patent No.: US 6,476,499 B1
(45) Date of Patent: Nov. 5, 2002

(54) SEMICONDUCTOR CHIP, CHIP-ON-CHIP STRUCTURE DEVICE AND ASSEMBLING METHOD THEREOF

(75) Inventors: Junichi Hikita; Koji Yamamoto; Isamu Nishimura; Nobuhisa Kumamoto, all of Kyoto (JP)

(73) Assignee: Rohm Co.,, Kyoto (JP)

(*) Notice: Subject to any disclaimer, the term of this patent is extended or adjusted under 35 U.S.C. 154(b) by 0 days.

(21) Appl. No.: 09/499,579

(22) Filed: Feb. 7, 2000

(30) Foreign Application Priority Data

| Feb. 8, 1999 | (JP) | ............ 11-030478 |
| Feb. 8, 1999 | (JP) | ............ 11-030479 |
| Feb. 8, 1999 | (JP) | ............ 11-030480 |
| Feb. 17, 1999 | (JP) | ............ 11-038794 |
| Feb. 24, 1999 | (JP) | ............ 11-047078 |

(51) Int. Cl.$^7$ .................. H01L 23/52; H01L 23/544
(52) U.S. Cl. ........................... 257/777; 257/797
(58) Field of Search ................. 257/777, 797; 361/760; 438/975, 401, 462

(56) References Cited

U.S. PATENT DOCUMENTS

| 3,795,845 A | * | 3/1974 | Cass et al. ............... 257/786 |
| 4,732,646 A | * | 3/1988 | Elsner et al. ............ 438/694 |
| 5,198,963 A | * | 3/1993 | Gupta et al. ............. 361/715 |
| 5,283,468 A | * | 2/1994 | Kondo et al. ............ 257/774 |
| 5,405,810 A | * | 4/1995 | Mizuno et al. ............ 438/16 |
| 5,422,435 A | * | 6/1995 | Takiar et al. ............ 174/52.4 |
| 5,434,453 A | * | 7/1995 | Yamamoto ............... 257/777 |
| 5,508,565 A | * | 4/1996 | Hatakeyama et al. ...... 257/777 |
| 5,572,068 A | * | 11/1996 | Chun ...................... 257/686 |
| 5,894,172 A | * | 4/1999 | Hyozo et al. ............ 257/797 |
| 6,133,637 A | * | 10/2000 | Hikita .................... 257/777 |
| 6,278,193 B1 | * | 8/2001 | Coico .................... 257/797 |

FOREIGN PATENT DOCUMENTS

| JP | 6-196534 | * | 7/1994 | ........ 438/FOR 435 |
| JP | 98/33217 | * | 7/1998 | |

* cited by examiner

Primary Examiner—Howard Weiss
Assistant Examiner—Marcos D. Pizarro-Crespo
(74) Attorney, Agent, or Firm—Rader, Fishman & Grauer PLLC

(57) ABSTRACT

A semiconductor chip (3) to be positioned with a front face thereof downward for formation of a chip-on-chip structure has electrode marks (35) provided on a back face (34) thereof. The electrode marks (35) are respectively provided in association with a plurality of electrodes (33) provided on the front face (31) of the semiconductor chip in the same arrangement as the arrangement of the electrodes (33). The arrangement of the electrode marks (35) represents the arrangement of the electrodes (33) on the front face (31) when viewed from the side of the back face (34) of the semiconductor chip 3. Therefore, the semiconductor chip (3) can easily be positioned with the front face downward on the basis of the electrode marks (35).

13 Claims, 13 Drawing Sheets

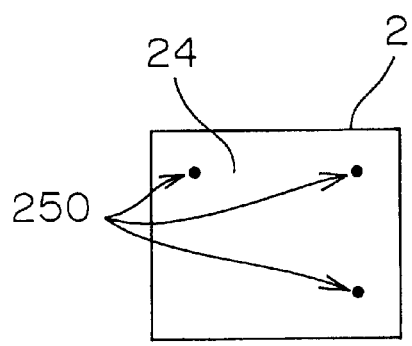
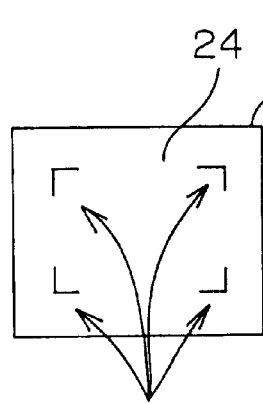
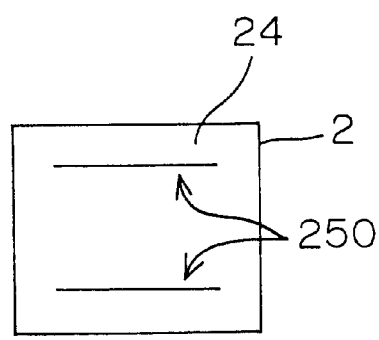
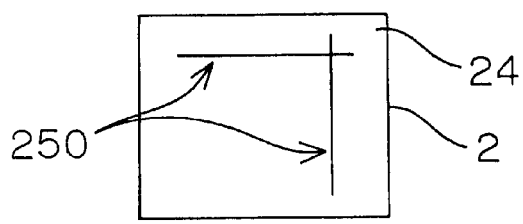
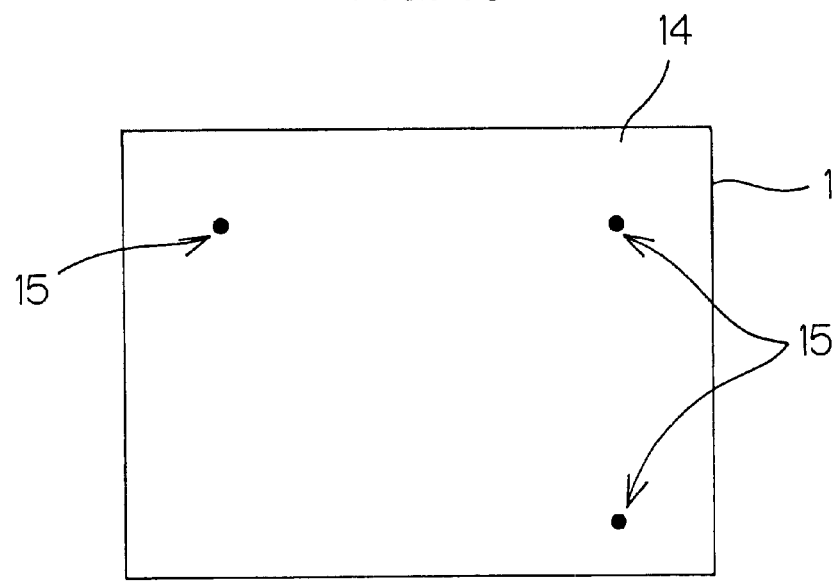

SEMICONDUCTOR CHIP, CHIP-ON-CHIP STRUCTURE DEVICE AND ASSEMBLING METHOD THEREOF

This application is based on application Nos. 11-30478, 11-30479, 11-30480, 11-38794 and 11-47078 filed in Japan, the contents of which are incorporated herein by reference.

BACKGROUND OF THE INVENTION

1. Field of the Invention

The present invention relates to semiconductor chips for a so-called chip-on-chip structure which includes a plurality of semiconductor chips bonded in a double-stacked relation, chip-on-chip semiconductor devices, and chip-on-chip mounting methods.

2. Description of Related Art

For size reduction and higher integration of semiconductor devices, a proposal has been made to shift the design concept from a conventional two-dimensional structure to a three-dimensional structure.

However, production of semiconductor devices of three-dimensional structure through a continuous process often encounters difficulties such as a lower yield.

The inventors of the present invention have been conducting studies on practical applications of a semiconductor device of a so-called chip-on-chip structure which includes a plurality of semiconductor chips bonded to one another in a face-to-face double-stacked relation.

Where semiconductor chips are bonded to each other in a stacked relation, for example, where a relatively small secondary chip is laid on the front face of a relatively large primary chip, the secondary chip can easily be positioned in alignment with the primary chip with the front face thereof upward and with the back face thereof opposed to the front face of the primary chip.

However, if an attempt is made to stack the primary chip and the secondary chip in a face-to-face relation, there is a difficulty in aligning these semiconductor chips with each other. This is because the orientation of a semiconductor chip, the arrangement of electrodes on the front face of the semiconductor chip and the like cannot be checked from the back side thereof.

Particularly, the electrodes are not always arranged in a predetermined positional relationship with the profile of the semiconductor chip, but the positional relationship between the electrode arrangement and the profile varies depending on dicing conditions under which a semiconductor wafer is diced into semiconductor chips. Therefore, it is difficult to align or position the semiconductor chips with respect to each other by viewing either of the semiconductor chips from the back side thereof.

Even if the primary and secondary chips have substantially the same size, the alignment of the semiconductor chips for bonding thereof is difficult.

SUMMARY OF THE INVENTION

In view of the foregoing, it is a principal object of the present invention to provide a chip-on-chip structure which includes a plurality of semiconductor chips bonded to one another in a face-to-face stacked relation for practical applications.

It is another object of the invention to provide a semiconductor chip for chip-on-chip mounting to provide the chip-on-chip structure for practical applications.

It is further another object of the invention to provide a chip-on-chip semiconductor device and a mounting method therefore.

A feature of the present invention is generally to provide marks such as an electrode mark, a back mark and an alignment mark on the back face of a semiconductor chip for recognition of the orientation of the semiconductor chip and the electrode arrangement on the semiconductor chip.

More specifically, (in accordance with an inventive aspect, there is provided a semiconductor chip for a chip-on-chip structure in which a plurality of semiconductor chips are bonded to one another in a stacked relation with electrode-carrying front faces thereof opposed to each other, the semiconductor chip comprising an electrode mark provided on a back face thereof in association with an electrode provided on a front face thereof.

In accordance with an inventive aspect, the semiconductor chip for the chip-on-chip structure according to claim 1 is characterized in that a plurality of electrodes are provided in a predetermined arrangement on the front face of the semiconductor chip, and a plurality of electrode marks are provided on the back face of the semiconductor chip in association with respective electrodes and in the same arrangement as the electrode arrangement.

In accordance with an inventive aspect, a semiconductor chip for a chip-on-chip structure is characterized in that a plurality of electrodes are provided in a predetermined arrangement on the front face of the semiconductor chip, and electrode marks are provided on the back face of the semiconductor chip in association with predetermined ones of the plurality of electrodes.

In accordance with an inventive aspect, there is provided a chip-on-chip semiconductor device which comprises a plurality of semiconductor chips bonded to one another in a stacked relation with electrode-carrying front faces thereof opposed to each other via electrodes provided on the opposed front faces, wherein electrode marks are provided on a back face of at least one of the stacked semiconductor chips in association with the electrodes on the front face of the one semiconductor chip.

In accordance with an inventive aspect, there is provided a chip-on-chip mounting method for stacking first and second semiconductor chips each having electrodes provided on a front face thereof so that the electrodes on the first semiconductor chip are bonded to the electrodes on the second semiconductor chip, the method comprising the steps of: placing the first semiconductor chip with the front face thereof upward; and positioning the second semiconductor chip with respect to the first semiconductor chip on the basis of electrode marks provided on a back face of the second semiconductor chip in association with the electrodes provided on the front face of the second semiconductor chip to mount the second semiconductor chip on the first semiconductor chip with the front face of the second semiconductor chip facing downward as opposed to the front face of the first semiconductor chip.

With the arrangements above, when the chip-on-chip structure is assembled with the front face of the semiconductor chip downward, the positioning of the semiconductor chip can be achieved on the basis of the electrode marks provided on the back face of the semiconductor chip. The electrode marks on the back face of the semiconductor chip are located in association with the electrodes on the front face of the semiconductor chip. The electrode marks provided in association with the electrodes may each be defined, for example, as a mark which surrounds an intersection between the back face and a phantom vertical line extending vertically through the semiconductor chip from an electrode. In other words, the electrode marks are each defined as a mark of an electrode as seen through the semiconductor chip from the back side thereof.

Therefore, with the electrode marks, the positions of the electrodes can be checked from the back side of the semiconductor chip, so that the semiconductor chip can properly be positioned with its face down in a desired position on another semiconductor chip to be bonded thereto. As a result, the chip-on-chip structure can be produced with almost no offset between the opposed electrodes. Since the positioning of the semiconductor chips is easy, the time required for assembling the chip-on-chip structure can be reduced.

Although the electrode marks are provided in association with respective electrodes, the electrode marks may be provided in association with specific ones of the electrodes for the purpose of the proper positioning of the semiconductor chip. For example, four electrode marks may be provided in association with electrodes disposed in four corners of the semiconductor chip.

With the arrangement according to one aspect of the instant invention, the chip-on-chip semiconductor device is provided in which the opposed electrodes are bonded to each other with a high level of precision, and the electrode positions of the semiconductor device can be checked. Further, it can be easily checked if the chip-on-chip semiconductor device is produced by employing one of the semiconductor chips above.

With the arrangement according to one aspect of the invention, the chip-on-chip structure can be assembled by utilizing the electrode marks. In other words, the chip-on-chip mounting method provides an assembling method for a chip-on-chip semiconductor device, which can be employed for practical applications on actual production lines.

In accordance with an inventive aspect, there is provided a primary semiconductor chip serving as a base to be mounted with a secondary semiconductor chip with a front face thereof bonded to a secondary semiconductor chip, the primary semiconductor chip comprising a mark provided on the front face thereof to be utilized as a positioning reference mark when the primary and secondary semiconductor chips are to be stacked.

In accordance with an inventive aspect, the primary semiconductor chip is characterized in that a plurality of secondary semiconductor chips are to be mounted on the front face of the primary semiconductor chip, and different positioning reference marks are provided on the front face of the primary semiconductor chip in association with chip mounting positions in which the respective secondary semiconductor chips are to be mounted.

In accordance with an inventive aspect, there is provided a method for mounting a secondary semiconductor chip on a front face of a primary semiconductor chip serving as a base, the method comprising the steps of: providing on the front face of the primary semiconductor chip a mark which serves as a positioning reference mark when the primary and secondary semiconductor chips are to be stacked; and positioning the secondary semiconductor chip on the front face of the primary semiconductor chip on the basis of the positioning reference mark.

With the arrangements above, the secondary semiconductor chip can be positioned with respect to the primary semiconductor chip on the basis of the positioning reference mark provided on the front face of the primary semiconductor chip.

Where the secondary semiconductor chip is to be mounted on the primary semiconductor chip, for example, with the use of mechanical hands by determining positioning coordinates for the secondary semiconductor chip on the basis of a profile-based positional relationship between the primary semiconductor chip and the secondary semiconductor chip, the positioning control is difficult.

This is because electrodes arranged on front faces of the semiconductor chips generally have a size on the order of 100$i$ and an allowable offset for the positioning of the semiconductor chips with the opposed electrodes of a size of 100$i$ aligned with each other is supposedly about ±5 to 10$i$.

However, the positioning offset cannot be accommodated within the aforesaid allowable range where the positioning is based on the positioning coordinates for the secondary semiconductor chip determined on the basis of the positional relationship between the primary semiconductor chip and the secondary semiconductor chip.

This is why the positioning of the secondary semiconductor chip is based on the positioning reference mark preliminarily provided on the front face of the primary semiconductor chip in accordance with the present invention.

Thus, the secondary semiconductor chip can properly be positioned with respect to the primary semiconductor chip with a positioning offset within the aforesaid allowable range.

The positioning reference mark is not necessarily required to have a great size but is preferably formed as a pin-point mark. This is because an image processing can more easily be performed on the pin-point mark for easy positioning of the secondary semiconductor chip.

The front face of the primary semiconductor chip is generally covered with a passivation film, so that the mark can be provided in any desired position.

With one of the arrangements above, the different positioning reference marks for the respective secondary semiconductor chips to be mounted on the primary semiconductor chip are provided on the front face of the primary semiconductor chip. This ensures easy image processing for properly positioning the plurality of secondary semiconductor chips in the predetermined positions on the primary semiconductor chip.

In accordance with an inventive aspect, there is provided a semiconductor chip for a chip-on-chip structure in which a plurality of semiconductor chips are bonded to one another in a face-to-face stacked relation, the semiconductor chip comprising a back mark provided on a back face thereof for recognition of orientation thereof and electrode arrangement thereon.

The back mark preferably includes at least two back marks.

The back mark preferably includes a tally mark which is to be brought into a predetermined positional relationship with a front mark provided on a front face of another semiconductor chip to be bonded to the semiconductor chip in a stacked relation.

With the provision of the back mark on the back face of the semiconductor chip for the chip-on-chip structure, the semiconductor chip can be positioned with respect to the another semiconductor chip on the basis of the back mark for formation of the chip-on-chip structure.

Particularly with the provision of two or more back marks, the orientations of the semiconductor chips to be stacked can correctly be checked on the basis of the two or more back marks.

Where the back mark is provided on one of the semiconductor chips and the front mark is provided on the other semiconductor chip, the semiconductor chips to be stacked can more easily be positioned with respect to each other by bringing the back mark and the front mark into a predetermined positional relationship. This arrangement is particularly effective where the two semiconductor chips to be stacked have different sizes. Further, this arrangement is advantageous in that proper positioning of the stacked semiconductor chips can be checked on the basis of the positional relationship between the front mark and the back mark after the assembling of the chip-on-chip structure.

Thus, the back mark provided on the semiconductor chip allows the semiconductor chip to be assembled into the chip-on-chip structure on a production line and the like. Since the positioning of the semiconductor chips with respect to each other can easily be achieved, the time required for assembling the chip-on-chip structure is effectively reduced.

In accordance with an inventive aspect the semiconductor chip for the chip-on-chip structure is characterized in that one of the plurality of semiconductor chips is a primary chip to be disposed with the front face thereof upward, and another of the plurality of semiconductor chips is a secondary chip to be bonded onto the primary chip with the front face thereof facing downward as opposed to the front face of the primary chip, and in that the back mark is provided on the secondary chip.

With this arrangement, the secondary chip can easily be positioned with respect to the primary chip when the primary and secondary chips are to be bonded to each other in a stacked relation. Particularly, when the secondary chip is to be mounted on the primary chip preliminarily positioned, the positioning of the secondary chip can easily be achieved.

In accordance with an inventive aspect the semiconductor chip for the chip-on-chip structure is characterized in that one of the plurality of semiconductor chips is a primary chip to be disposed with the front face thereof upward, and another of the plurality of semiconductor chips is a secondary chip to be bonded onto the primary chip with the front face thereof facing downward as opposed to the front face of the primary chip, and in that the back mark is provided on the primary chip.

With this arrangement, the primary chip can easily be positioned with respect to the secondary chip preliminarily positioned, or the positioning of the secondary chip can be controlled on the basis of the back mark on the primary chip.

In accordance with an inventive aspect, the semiconductor chip for the chip-on-chip structure is characterized in that one of the plurality of semiconductor chips is a primary chip to be disposed with the front face thereof upward, and another of the plurality of semiconductor chips is a secondary chip to be bonded onto the primary chip with the front face thereof facing downward as opposed to the front face of the primary chip, and in that the primary chip and the secondary chip are each provided with the back mark.

This arrangement is advantageous not only where either the primary chip or the secondary chip is preliminarily positioned but also where the primary and secondary chips each held by a robot arm or the like are positioned with respect to each other.

In accordance with an inventive aspect, the semiconductor chip for the chip-on-chip structure is characterized in that one of the plurality of semiconductor chips is a primary chip to be disposed with the front face thereof upward, and another of the plurality of semiconductor chips is a secondary chip to be bonded onto the primary chip with the front face thereof facing downward as opposed to the front face of the primary chip, and in that the front mark is provided on the front face of the primary chip and the back mark is provided on the secondary chip in a predetermined positional relationship with the front mark on the primary chip.

This arrangement is advantageous in that the primary and secondary chips can easily be positioned with respect to each other and whether or not any offset occurs between the primary and secondary chips can be checked after the chips are bonded to each other to form the chip-on-chip structure.

In accordance with an inventive aspect, the semiconductor chip for the chip-on-chip structure is characterized in that a lead frame is fitted on the back face of the primary chip, and the back mark is provided in a predetermined position on the lead frame.

With this arrangement, the fitting of the lead frame is easy, and the formation of the chip-on-chip structure can be achieved by utilizing the back mark on the lead frame in the same manner as the back mark on the primary chip.

In accordance with an inventive aspect, there is provided a chip-on-chip semiconductor device, which comprises a first semiconductor chip disposed with a front face thereof upward, and a second semiconductor chip bonded to the first semiconductor chip with a front face thereof facing downward as opposed to the front face of the first semiconductor chip, wherein a back mark is provided on a back face of the second semiconductor chip so that the first and second semiconductor chips are positioned with respect to each other on the basis of the back mark.

The back mark preferably includes at least two back marks.

In the chip-on-chip semiconductor device, a front mark may be provided on the front face of the first semiconductor chip in a predetermined positional relationship with the back mark, and the first and second semiconductor chips have been positioned with respect to each other by bringing the back mark and the front mark into the predetermined positional relationship.

With this arrangement, the chip-on-chip semiconductor device can be provided in which the first and second semiconductor chips are properly positioned with respect to each other and bonded to each other.

Further, it can be checked whether or not the positioning of the semiconductor chips with respect to each other is proper.

In accordance with an inventive aspect, there is provided a chip-on-chip mounting method, which comprises the steps of: placing a first semiconductor chip with a front face thereof upward; and positioning a second semiconductor chip with respect to the first semiconductor chip on the basis of a back mark provided on a back face of the second semiconductor chip to bond the first and second semiconductor chips to each other in a stacked relation with a front face of the second semiconductor chip kept in a predetermined relation with the front face of the first semiconductor chip.

In accordance with an inventive aspect, there is provided a chip-on-chip mounting method, which comprises the steps of: placing a first semiconductor chip having a back mark provided on a back face thereof with a front face thereof upward; and positioning a second semiconductor chip with respect to the first semiconductor chip on the basis of the back mark provided on the first semiconductor chip to bond the first and second semiconductor chips to each other in a stacked relation with a front face of the second semiconductor chip kept in a predetermined relation with the front face of the first semiconductor chip.

In the aforesaid mounting methods, a front mark to be brought into a predetermined positional relationship with the back mark provided on the second or first semiconductor chip may be provided on the front face of the first or second semiconductor chip not provided with the back mark, and the positioning may be achieved by bringing the back mark and the front mark into the predetermined positional relationship.

This arrangement provides a practical assembling method for a chip-on-chip semiconductor device. In other words, the assembling method for the chip-on-chip semiconductor device can be employed for practical applications on a production line or the like.

In these mounting methods, provision of two or more back marks is advantageous in practical applications.

Further, it can be checked whether or not the positioning of the first and second semiconductor chips with respect to each other is proper in the chip-on-chip structure obtained through any of these methods.

In accordance with the present invention, the semiconductor chips, the semiconductor devices and the mounting methods are provided for realizing the chip-on-chip structure.

In accordance with an inventive aspect, there is provided a semiconductor chip to be employed for assembling a chip-on-chip structure in which semiconductor chips are bonded to each other in a face-to-face stacked relation, the semiconductor chip comprising an informational notation specific thereto provided on a back face thereof to be utilized at least when the chip-on-chip structure is assembled.

In accordance with an inventive aspect, there is provided a chip-on-chip semiconductor device which comprises a plurality of semiconductor chips bonded to one another in a face-to-face stacked relation, wherein at least one of the stacked semiconductor chips has an informational notation specific thereto provided on a back face thereof.

In the chip-on-chip semiconductor device, the plurality of semiconductor chips each have an informational notation specific thereto provided on a back face thereof.

The specific informational notation preferably includes at least one informational notation selected from a model designation of the semiconductor chip, a production lot number of the semiconductor chip and an alignment mark to be utilized for assembling a chip-on-chip structure by employing the semiconductor chip.

The specific informational notation is preferably represented by a bar code and a two-dimensional code.

The semiconductor chip for the chip-on-chip structure in accordance with one aspect of the invention is mounted on another semiconductor chip on the basis of the specific informational notation provided on the back face of the semiconductor chip for assembling the chip-on-chip structure.

More specifically, if an alignment mark for recognition of the orientation of the semiconductor chip, the electrode arrangement on the semiconductor chip or the like is provided as the informational notation, the semiconductor chip can easily be positioned with respect to another semiconductor chip on the basis of the alignment mark so as to be mounted on the another chip with the front face thereof downward.

The specific informational notation may be a human-recognizable notation, or may be a notation optically detectable by an OCR, or a bar-code notation. Alternatively, a plurality of notations may be provided in different forms in combination.

When the chip-on-chip structure is to be assembled, proper semiconductor chips are selected from different types of semiconductor chips by reading the specific informational notations, and positioning information is obtained by reading the informational notations by an assembling robot.

After the assembling of the chip-on-chip structure, whether or not the semiconductor chips have properly been assembled into the chip-on-chip structure can easily be checked on the basis of the informational notations.

With one arrangement of the instant invention, whether or not predetermined semiconductor chips are employed as components of the chip-on-chip semiconductor device can easily be checked by reading the specific informational notations provided on the respective semiconductor chips.

Further, whether or not the assembled state of the device, e.g., the orientation, position and the like of each of the semiconductor chips, is proper can be judged on the basis of the specific informational notations.

The chip-on-chip semiconductor device is molded and then delivered to the market and, when a need arises to check makers and the like of the respective semiconductor chips incorporated in the semiconductor device, the back faces of the semiconductor chips are exposed from a mold package for checking the specific informational notations of the semiconductor chips. Thus, production information on the semiconductor chips can be checked.

In accordance with an inventive aspect, there is provided a semiconductor chip for a chip-on-chip structure in which a plurality of semiconductor chips are bonded to one another in a face-to-face stacked relation, the semiconductor chip having a positioning pin hole extending therethrough from a front face to a back face thereof for recognition of an electrode arrangements an electrode type and the like from the back side thereof.

With one of the arrangements according to the instant invention, the positioning pin hole is formed in the semiconductor chip for the chip-on-chip structure as extending therethrough from the front face to the back face thereof. When the chip-on-chip structure is assembled, the predetermined positioning of the semiconductor chip can be performed on the basis of the positioning pin hole from the back side thereof, so that the semiconductor chip can easily be positioned on a front face of another semiconductor chip with a high level of precision by viewing the semiconductor chip from the back side thereof.

Since the positioning can easily be achieved, the time required for the assembling of the chip-on-chip structure can be reduced advantageously for practical applications.

Where a plurality of positioning pin holes are formed in the semiconductor chip, the orientation of the mounted semiconductor chip can correctly be checked on the basis of the plurality of positioning pin holes.

In accordance with another inventive aspect, there is provided a chip-on-chip semiconductor device, which comprises a first semiconductor chip disposed with a front face thereof upward, and a second semiconductor chip bonded to the first semiconductor chip with a front face thereof facing downward as opposed to the front face of the first semiconductor chip, wherein the second semiconductor chip has a positioning pin hole extending therethrough from the front face to a back face thereof so that the first and second semiconductor chips are positioned with respect to each other on the basis of the positioning pin hole.

With this arrangement, the first and second semiconductor chips bonded to each other in a properly positioned state can be incorporated in the chip-on-chip semiconductor device.

In accordance with another inventive aspect, there is provided a chip-on-chip mounting method, which comprises the steps of: placing a first semiconductor chip with a front face thereof upward; and positioning a second semiconductor chip having a positioning pin hole with respect to the first semiconductor chip on the basis of a positioning pin hole formed in the second semiconductor chip to bond the first and second semiconductor chips to each other in a stacked relation with a front face of the second semiconductor chip kept in a predetermined positional relation with the front face of the first semiconductor chip.

This arrangement provides a practical mounting method for a chip-on-chip semiconductor device. That is, the chip-on-chip mounting method can be employed for practical applications on a production line and the like, and the chip-on-chip structure can be assembled in a shorter time.

Embodiments of the present invention will hereinafter be described with reference to the attached drawings.

BRIEF DESCRIPTION OF THE DRAWINGS

FIGS. 9A to 9D are diagrams illustrating exemplary back marks provided on a back face of a secondary chip;

FIG. 10 is a diagram illustrating back marks provided on a back face of a primary chip;

DESCRIPTION OF THE PREFERRED EMBODIMENTS

First, an explanation will briefly be given to a reason why electrodes provided on a semiconductor chip are not always arranged in a predetermined positional relationship with respect to the profile of the semiconductor chip but the positional relationship tends to vary.

Figure 1B:
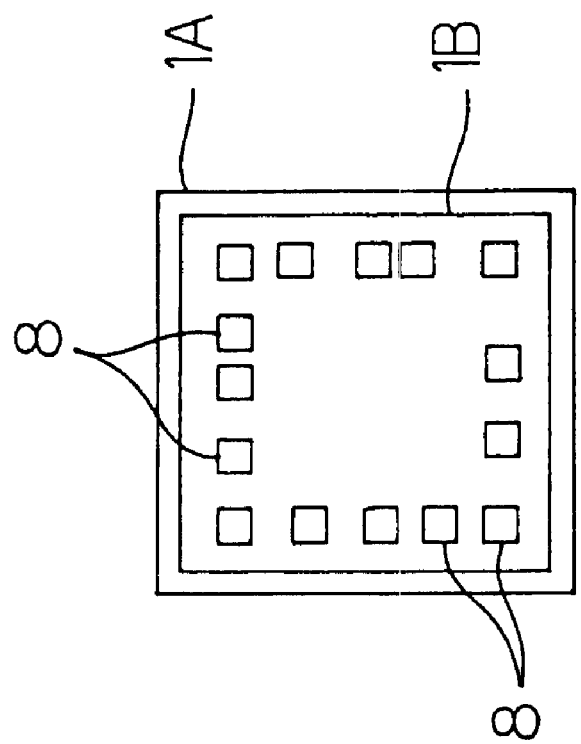
FIG. 1B is a schematic plan view illustrating a positional relationship between an electrode arrangement and profiles of a relatively large semiconductor chip and a relatively small semiconductor chip which are diced from the semiconductor wafer.
Figure 1A:
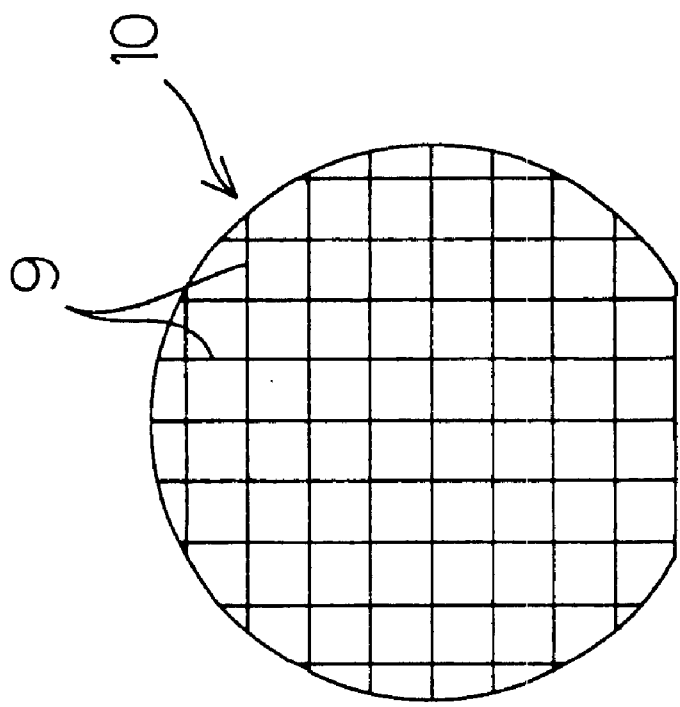
FIG. 1A is a schematic plan view of a semiconductor wafer.

FIG. 1A is a schematic plan view of a semiconductor wafer 10. An integrated circuit and the like are formed in each predefined area of the semiconductor wafer 10. The semiconductor wafer 10 is diced (or cut) along scribe lines 9 into a plurality of separate semiconductor chips by means of a dicing saw.

The semiconductor chips thus cut out tend to have different exterior sizes due to slight misalignment of the dicing saw with respect to each scribe line 9 which occurs when the semiconductor wafer 10 is cut along the scribe line 9. As a result, a semiconductor chip 1A having a larger plan (exterior) size and a semiconductor chip 1B having a smaller plan size are produced as shown in FIG. 1B. The semiconductor chips, which have different exterior sizes, each equally have the integrated circuit and electrodes 8 provided on a front face thereof. In the semiconductor chip 1B of a smaller exterior size, the electrodes 8 are located relatively close to the periphery thereof. In the semiconductor chip 1A of a larger exterior size, on the other hand, the electrodes 8 are located relatively inwardly of the periphery thereof. Thus, the electrodes 8 are not always located in the same positional relationship with respect to the profile of each semiconductor chip, so that the aforesaid problem is encountered which is to be solved by the present invention.

Figure 2:
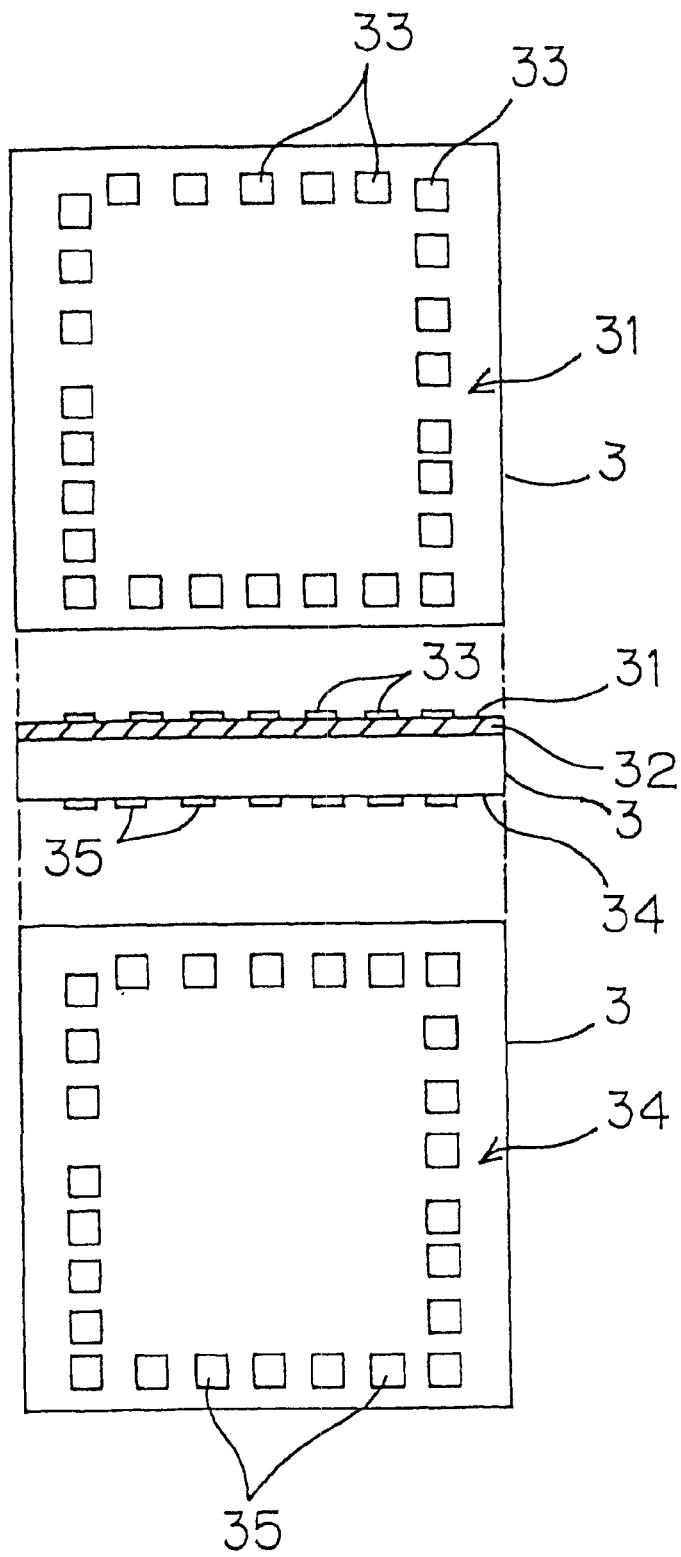
FIG. 2A is a schematic vertical sectional view of a semiconductor chip for chip-on-chip mounting in accordance with one embodiment of the present invention.
FIGS. 2B and 2C are a schematic plan view and a schematic bottom view, respectively, of the semiconductor chip.

FIGS. 2A to 2C illustrate the construction of a semiconductor chip 3 for chip-on-chip mounting in accordance with one embodiment of the present invention. Particularly, FIGS. 2A, 2B and 2C are a schematic vertical sectional view, a schematic plan view and a schematic bottom view, respectively, of the semiconductor chip. The semiconductor chip 3 is composed of a semiconductor such as silicon, GaAs or Ge. The semiconductor chip 3 for chip-on-chip mounting has an active region 32 provided in a front face 31 thereof, in which an integrated circuit and the like have been formed. A plurality of electrodes 33 are provided in a predetermined arrangement on the front face 31.

A plurality of electrode marks 35 are provided on a back face 34 of the semiconductor chip 3 in association with the electrodes 33 provided on the front face 31. This is a feature of this embodiment.

The plurality of electrode marks 35 are disposed in the same arrangement as the electrode arrangement and correspond to the respective electrodes 33. Accordingly, the arrangement of the electrode marks 35 represents the arrangement of the electrodes 33 provided on the front face 31 when viewed from the side of the back face 34 of the semiconductor chip 3.

Therefore, when the semiconductor chip 3 is mounted on another semiconductor chip with the front face 31 thereof facing downward as opposed to a front face of the another semiconductor chip, the semiconductor chip 3 can be positioned with respect to the another semiconductor chip on the basis of the electrode marks 35. As a result, the semiconductor chips can be bonded to each other with almost no offset between the opposed electrodes thereof.

Figure 3:
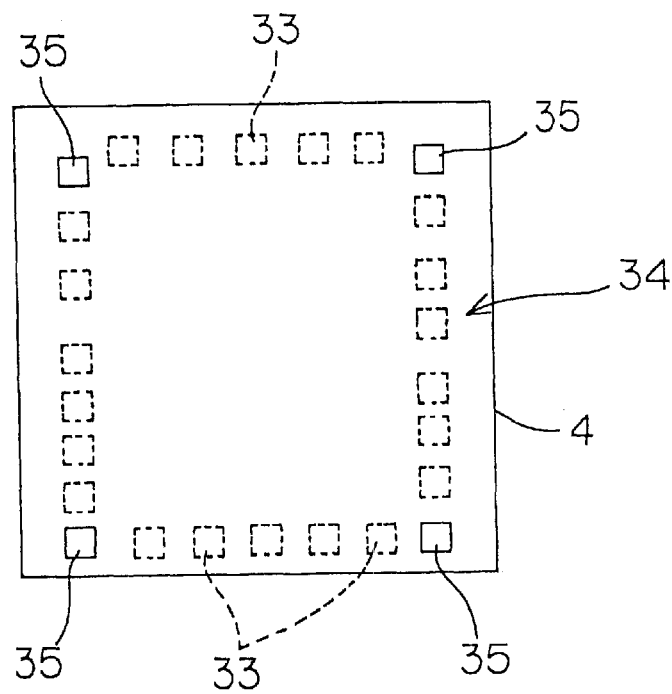
FIG. 3 is a schematic bottom view of a semiconductor chip according to another embodiment of the invention.

FIG. 3 is a schematic bottom view of a semiconductor chip 4 according to another embodiment of the invention. In the semiconductor chip 4 shown in FIG. 3, electrode marks 35 are provided on a back face 34 thereof in association with predetermined ones of electrodes 33 provided on a front face thereof. More specifically, four electrode marks 35 are provided on the back face 34 of the semiconductor chip 4, for example, in association with electrodes provided in four corners of the semiconductor chip 4. In FIG. 3, the other electrodes on the front face are denoted in broken lines by reference numeral 33, and no electrode mark is provided for those electrodes 33. In this embodiment, the arrangement of the electrodes can be checked from the side of the back face 34 by way of the electrode marks 35 provided in the four corners in association of the corner electrodes. Therefore, the semiconductor chip 4 can easily be positioned with respect to another semiconductor chip with its face down for formation of the chip-on-chip structure, like the semiconductor chip 3 described with reference to FIGS. 2A to 2C.

The provision of the four electrode marks 35 in association with the four corner electrodes is merely illustrative, and the number and arrangement of the electrode marks 35 to be provided may be determined as desired.

The electrode marks 35 on the semiconductor chip 3 or 4 are formed on a wafer before the wafer is diced for production of the semiconductor chip 3 or 4. The electrode marks 35 maybe formed,for example, by a printing process or a laser process. Alternatively, a dual side aligner may be employed when the electrodes and bumps are formed on the front face through light exposure, so that the electrode marks 35 are formed on the back face through light exposure simultaneously with the formation of the electrodes and the like on the front face in a production process.

Figure 4:
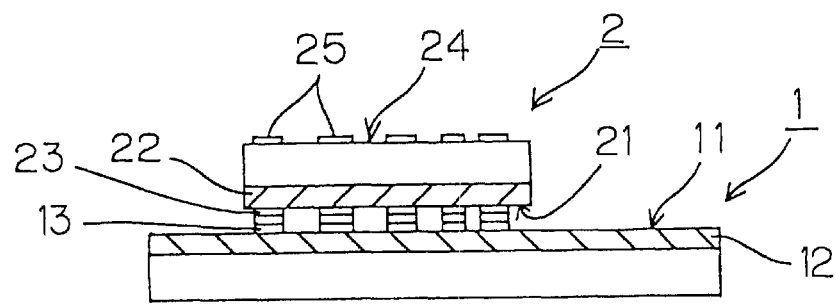
FIG. 4A is a schematic vertical sectional view of a chip-on-chip semiconductor device according to further another embodiment of the invention.
FIG. 4B is a schematic plan view of the semiconductor device.
Figure 4:
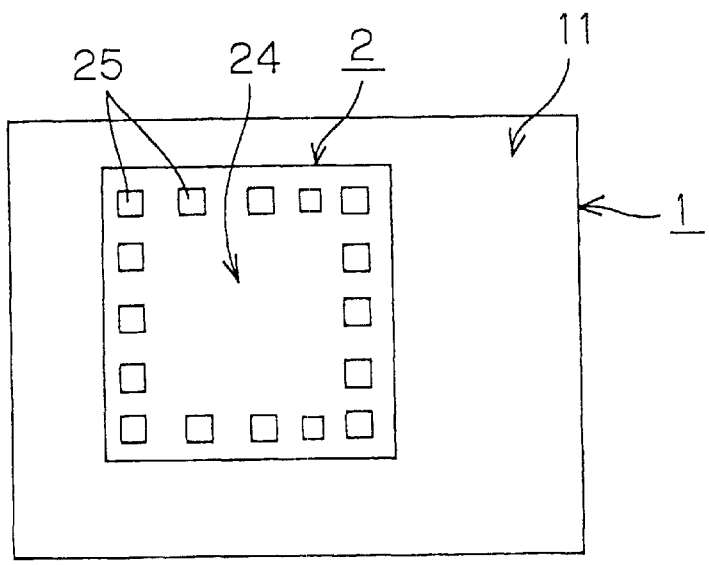

FIG. 4A is a schematic vertical sectional view of a chip-on-chip semiconductor device according to further another embodiment of the invention, and FIG. 4B is a schematic plan view of the semiconductor device.

Referring to FIGS. 4A and 4B, the chip-on-chip semiconductor device includes a primary chip (or mother chip) 1 and a secondary chip (or daughter chip) 2 which are disposed in a double-stacked relation. The primary chip 1 and the secondary chip 2 are semiconductor chips such as of silicon, GaAs or Ge. In this embodiment, the primary chip 1 and the secondary chip 2 are silicon chips, but any types of semiconductor chips may be employed in combination. For example, the primary chip 1 and the secondary chip 2 may be composed of silicon and GaAs, respectively, or may be composed of semiconductors in any other combination.

The primary chip 1 and the secondary chip 2 are bonded to each other with a front face 11 of the primary chip opposed to a front face 21 of the secondary chip 2. The primary chip 1 has an active region 12 provided in the front face thereof, in which an integrated circuit and the like have been formed. Similarly, the secondary chip 2 has an active region 22 provided in the front face 21 thereof, in which an integrated circuit and the like have been formed. The stacked primary and secondary chips 1, 2 are bonded to each other via bumps which respectively connect electrodes 13 provided on the front face 11 of the primary chip to electrodes 23 provided on the front face 21 of the secondary chip.

For assembling of the chip-on-chip semiconductor device, the primary chip 1 is first placed with the front face 11 thereof upward, and then the secondary chip 2 is positioned with respect to the primary chip 1 with the front face 21 of the secondary chip 2 facing downward. At this time, the positions of the electrodes provided on the front face of the secondary chip 2 can be checked by way of electrode marks 25 provided on a back face 24 of the secondary chip 2. Therefore, the secondary chip 2 can properly be positioned with respect to the primary chip 1 on the basis of the electrode marks 25. As a result, the electrodes 13 on the primary chip 1 can respectively be connected to the electrodes 23 on the secondary chip 2 via the bumps with almost no offset.

In the chip-on-chip semiconductor device shown in FIGS. 4A and 4B, the electrode marks 25 are provided on the back face 24 of the secondary chip 2. Therefore, it can be checked whether or not the electrodes of the secondary chip 2 are offset from the corresponding electrodes and circuit arrangement on the front face 11 of the primary chip 1 in the assembled chip-on-chip semiconductor device.

From another viewpoint, it can be checked at a glance whether or not the chip-on-chip semiconductor device is produced by employing the aforesaid semiconductor chip 3 or 4 for chip-on-chip mounting provided with the electrode marks 35.

Figure 5:
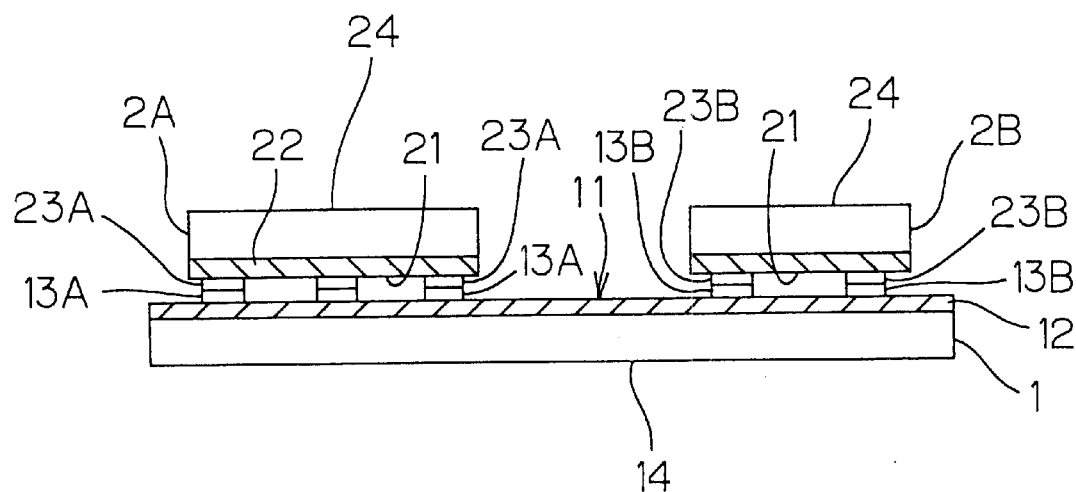
FIG. 5 is a schematic vertical sectional view illustrating the construction of a chip-on-chip semiconductor device employing a semiconductor chip for chip-on-chip mounting in accordance with still another embodiment of the invention.

FIG. 5 is a schematic vertical sectional view illustrating the construction of a chip-on-chip semiconductor device produced by employing semiconductor chips for chip-on-chip mounting in combination in accordance with still another embodiment of the invention. The semiconductor device includes a primary chip 1 and two secondary chips 2A, 2B. The primary chip 1 and the two secondary chips (second chip and third chip) 2A, 2B are semiconductor chips such as of silicon (Si) , gallium arsenide (GaAs) or germanium (Ge). The primary chip 1 and the two secondary chips 2A, 2B are preferably composed of the same semiconductor, e.g., silicon, but the semiconductor material therefor is not limited thereto. For example, the primary chip 1 and the secondary chips 2A, 2B may be composed of silicon and gallium arsenide, respectively, or may be composed of semiconductors in any other combination.

The primary chip 1 is bonded to the secondary chips 2A, 2B in a stacked relation with a front face 11 of the primary chip 1 opposed to front faces 21 of the secondary chips 2A, 2B. The primary chip 1 has an active region 12 provided in the front face 11 thereof, in which an integrated circuit and the like have been formed. Similarly, the secondary chips 2A, 2B each have an active region 22 provided in the front face 21 thereof, in which an integrated circuit and the like have been formed. The primary chip 1 is bonded to the secondary chips 2A, 2B thus stacked via bumps which respectively connect electrodes 13A, 13B provided on the front face 11 of the primary chip to electrodes 23A, 23B provided on the front faces 21 of the secondary chips.

In FIG. 5, a reference numeral 14 denotes a back face of the primary chip 1, and a reference numeral 24 denotes back faces of the secondary chips 2A, 2B.

Figure 6:
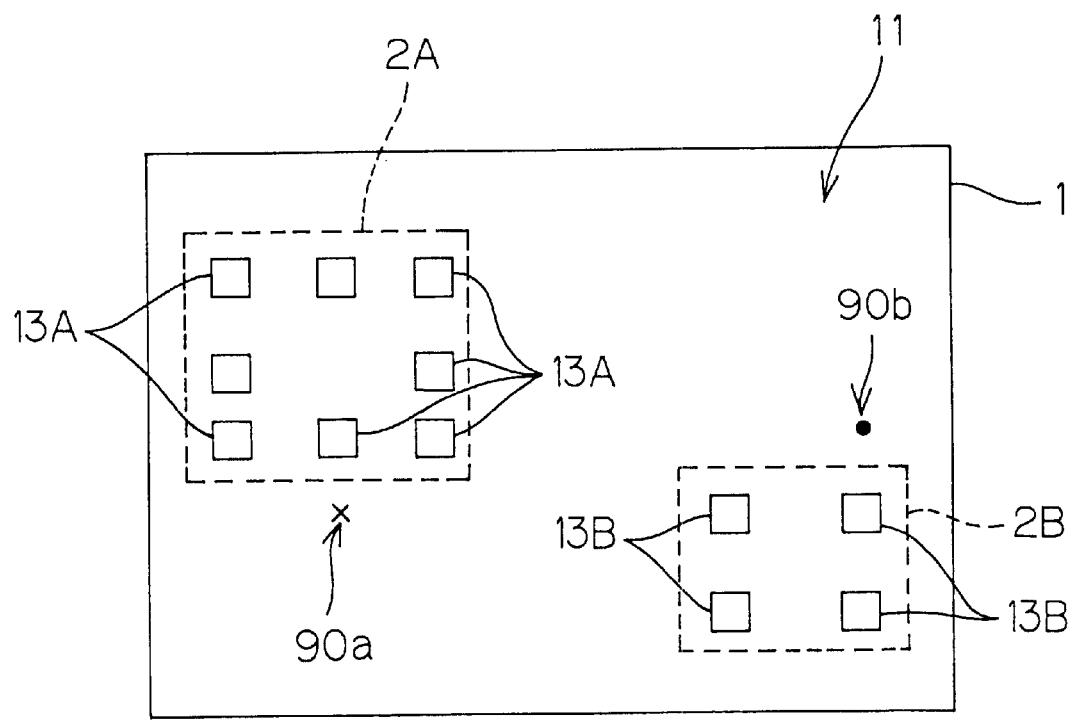
FIG. 6 is a schematic plan view of a primary semiconductor chip for chip-on-chip mounting in accordance with further another embodiment of the invention.

FIG. 6 is a schematic plan view of the primary chip 1 of the chip-on-chip semiconductor device shown in FIG. 5, wherein the positions of the stacked secondary chips 2A, 2B are indicated by broken lines.

A feature of the primary chip 1 in this embodiment is that positioning reference marks 90a, 90b are provided on the front face 11 thereof for the positioning of the secondary chips 2A, 2B.

One 90a of the positioning reference marks serves as a reference point for positioning the secondary chip 2A on the front face 11 of the primary chip 1 for mounting thereof. The secondary chip 2A is positioned on the front face 11 of the primary chip 1 with the front face thereof downward. By the positioning on the basis of the positioning reference mark 90a, the secondary chip 2A can properly be disposed in a predetermined stacked relation with the primary chip. The positioning reference mark 90a is provided in a predetermined positional relationship with the electrodes 13A to be connected to the secondary chip 2A. Therefore, the positioning of the secondary chip 2A can be achieved with a higher level of precision than in a case where the positioning of the secondary chip 2A is achieved by determining the coordinates of the secondary chip 2A on the basis of a relationship between the profiles of the primary chip 1 and the secondary chip 2A.

Similarly, the mounting of the secondary chip 2B is achieved by positioning the secondary chip 2B on the basis of the positioning reference mark 90b.

In this embodiment, the positioning reference mark 90a for the secondary chip 2A and the positioning reference mark 90b for the secondary chip 2B have different shapes. Therefore, it is easy to identify the positioning reference marks 90a, 90b by image processing or the like. On the basis of the result of the image processing, the secondary chips 2A, 2B can be located in predetermined positions on the primary chip.

The positioning reference marks 90a and 90b can respectively be provided in any desired positions having predetermined positional relationships with the electrodes 13A and 13B. The front face 11 of the primary chip 1 except for the electrodes is generally covered with a passivation film, so that the marks 90a, 90b can be provided in any desired positions on the passivation film.

Formation of the marks 90a, 90b may be achieved, for example, by a printing process or a laser process. Alternatively, the marks may be formed in association with the electrode positions by employing an aligner for light exposure of an integrated circuit pattern in the active region in a production process.

By thus providing the positioning reference marks 90a, 90b, the mounting positions of the secondary chips 2A, 2B can clearly be defined for proper positioning of the secondary chips 2A, 2B when the secondary chips 2A, 2B are mounted on the front face 11 of the primary chip 1. As a result, electrical connection between the electrodes 13A of the primary chip 1 and the electrodes 23A of the secondary chip 2A and between the electrodes 13B of the primary chip 1 and the electrodes 23B of the secondary chip 2B can assuredly be established.

The positions and shapes of the positioning reference marks 90a, 90b provided on the primary chip 1 in the aforesaid embodiment are merely illustrative, and various modifications may be made thereto. For example, the mark 90a may be located in a position which allows for registration with an edge of the secondary chip 2A. Alternatively, a plurality of marks 90a may be provided on the primary chip so that the positioning of the secondary chip 2A can be based on the plurality of marks 90a.

Figure 7:
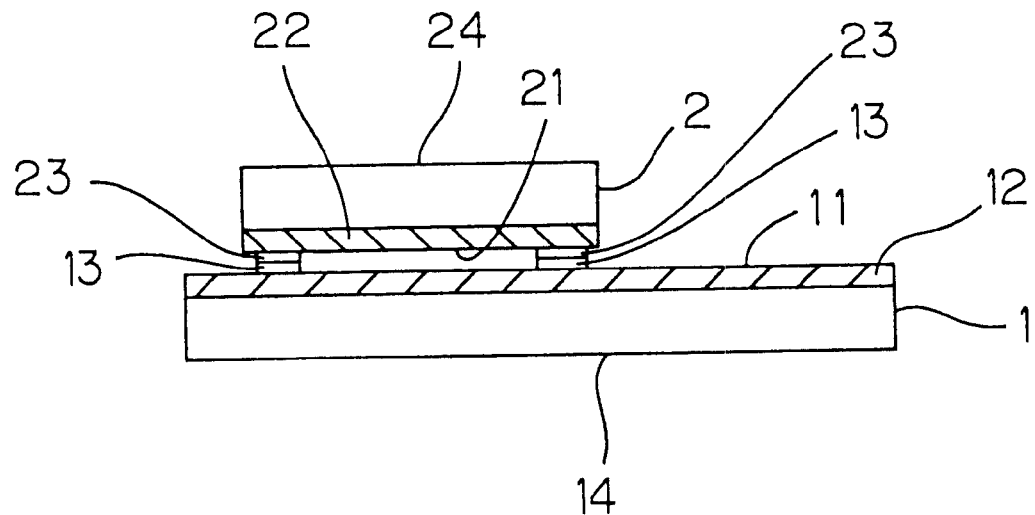
FIG. 7 is a schematic vertical sectional view illustrating the construction of a chip-on-chip semiconductor device according to still another embodiment of the invention.

FIG. 7 is a schematic vertical sectional view illustrating the construction of a chip-on-chip semiconductor device according to still another embodiment of the invention. The semiconductor device includes a primary chip 1 and a secondary chip 2. The primary chip 1 and the secondary chip 2 are semiconductor chips such as of silicon, gallium arsenide (GaAs) or germanium (Ge). The primary chip 1 and the secondary chip 2 are preferably composed of the same semiconductor, e.g., silicon, but the semiconductor material therefor is not limited thereto. For example, the primary chip 1 and the secondary chip 2 may be composed of silicon and GaAs, respectively, or may be composed of semiconductors in any other combination.

The primary chip 1 and the secondary chip 2 are bonded to each other with a front face 11 of the primary chip 1 opposed to a front face 21 of the secondary chip 2. The primary chip 1 has an active region 12 provided in the front face 11 thereof, in which an integrated circuit and the like have been formed. Similarly, the secondary chip 2 has an active region 22 provided in the front face 21 thereof, in which an integrated circuit and the like have been formed. The stacked primary and secondary chips 1, 2 are bonded to each other with electrodes 13 on the front face 11 respectively connected to electrodes 23 on the front face 21.

In FIG. 7, a reference numeral 14 denotes a back face of the primary chip 1, and a reference numeral 24 denotes a back face of the secondary chip 2.

Figure 8:
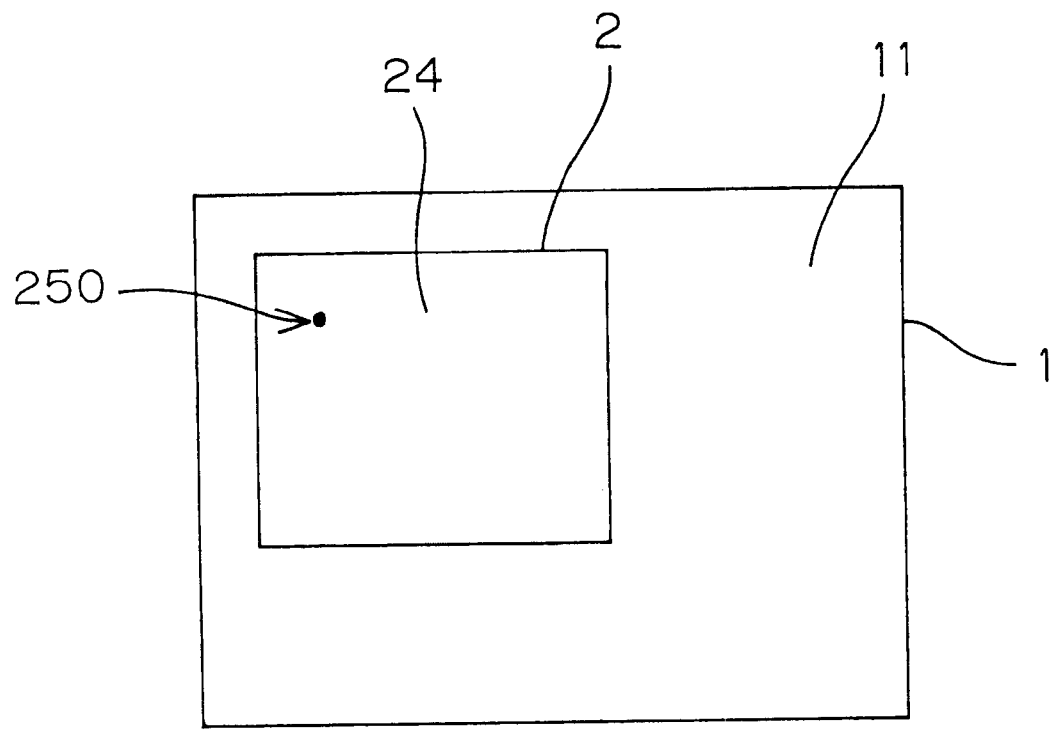
FIG. 8 is a schematic plan view of the chip-on-chip semiconductor device shown in FIG. 7.

FIG. 8 is a schematic plan view of the chip-on-chip semiconductor device. A feature of this embodiment is that a back mark 250 is provided on the back face 24 of the secondary chip 2. The back mark 250 allows for recognition of the orientation of the secondary chip 2, the arrangement of the electrodes 23 provided on the front face 21 of the secondary chip 2, and the like. When the primary chip 1 is placed with the front face 11 thereof upward and the secondary chip 2 is positioned with respect to the primary chip 1 with the front face thereof downward, the positioning of the secondary chip 2 can be achieved on the basis of the back mark 250. More specifically, the orientation of the secondary chip 2 can be recognized by way of the back mark 250, so that there is no possibility that the secondary chip 2 is mounted on the primary chip 1 with a 180-degree angular offset. If the back mark 250 has a specific positional relationship with any of the electrodes 23 (see FIG. 7) provided on the front face 21 of the secondary chip 2, e.g., if a predetermined electrode 23 is located on a vertical line extending through the back mark 250, the electrode arrangement on the secondary chip 2 can be recognized on the basis of the back mark 250.

Though not shown in FIG. 8, the circuit arrangement and the electrodes are provided on the front face 11 (active region) of the primary chip 1 in a recognizable manner. Therefore, the back mark 250 on the back face 24 of the secondary chip 2 is properly positioned with respect to the circuit arrangement and the electrodes on the front face 11 of the primary chip 1 when the secondary chip 2 is mounted on the primary chip 1.

Since the back mark 250 is thus provided on the back face 24 of the secondary chip 2, the positioning of the secondary chip 2 can easily be achieved on the basis of the back mark 250.

FIGS. 9A to 9D are diagrams illustrating examples of the back mark 250 provided on the back face 24 of the secondary chip 2. Although the single back mark 250 is provided in FIG. 8, a plurality of back marks may be provided.

FIG. 9A illustrates three back marks 250 provided in three corners of the back face 24.

As shown in FIG. 9A, the back marks 250 are each represented by "·" (point or circle), but may each be represented by "L" (hook- or L-shape), "+", "−" or the like.

Alternatively, the back marks 250 may each be represented by a line which extends along an edge of the secondary chip 2 as shown in FIG. 9C.

Further, the back marks 250 may be represented by crossed lines as shown in FIG. 9D.

Besides those shown in FIGS. 8 and 9A to 9D, any notations and marks such as characters and symbols may be employed as the back marks 250.

The back face 24 of the secondary chip 2 is generally a mirror-like surface, so that the arrangement of the electrodes provided on the front face of the secondary chip 2 cannot be recognized from the side of the back face 24. This is why the back marks 250 are provided on the back face 24 for recognition of the orientation and electrode arrangement of the secondary chip 2.

The back marks 250 are formed on a wafer before the wafer is diced for production of the secondary chip 2. The formation of the back marks 250 may be achieved by a printing process or a laser process. Alternatively, the marks may be formed in association with the electrode positions by employing a dual-side aligner as an aligner for light exposure of an integrated circuit pattern in the active region in a production process.

Although the foregoing explanation is directed to a case where the back marks 250 are provided on the back face 24 of the secondary chip 2, back marks may be provided on the primary chip 1. More specifically, back marks 15 may be provided on the back face 14 of the primary chip 1 as shown in FIG. 10. Where the secondary chip 2 is mounted on the front face 11 of the primary chip 1 for production of the chip-on-chip semiconductor device, the positioning of the secondary chip 2 can be controlled on the basis of the back marks 15 provided on the back face 14 of the primary chip 1. The back marks 15 on the primary chip 1 is effective for such an application.

The back marks 15 on the primary chip 1 are not limited to those illustrated in FIG. 10, but may have any of various shapes and forms like the back marks 250 on the secondary chip 2 illustrated in FIGS. 8 and 9A to 9D.

In the assembled chip-on-chip semiconductor device, the back marks 250 may be provided only on the secondary chip 2, or the back marks 15 may be provided only on the primary chip 1. Alternatively, the back marks 15 and 250 may be provided on the primary chip 1 and the secondary chip 2, respectively.

Figure 11:
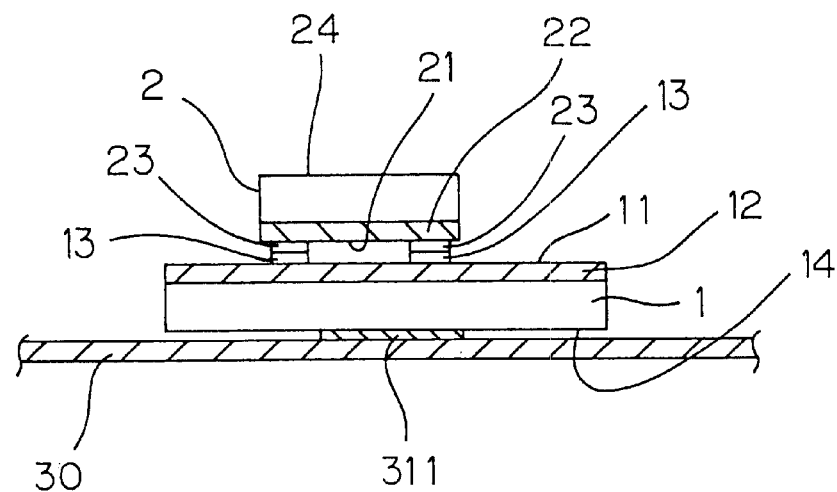
FIG. 11 is a schematic vertical sectional view illustrating the construction of a chip-on-chip semiconductor device according to further another embodiment of the invention.

FIG. 11 is a schematic vertical sectional view illustrating the construction of a chip-on-chip semiconductor device according to further another embodiment of the invention. In this semiconductor device, a lead frame 30 is attached to a back face 14 of a primary chip 1. The lead frame 30 is bonded onto the back face 14 of the primary chip 1 by an adhesive 311.

Figure 12:
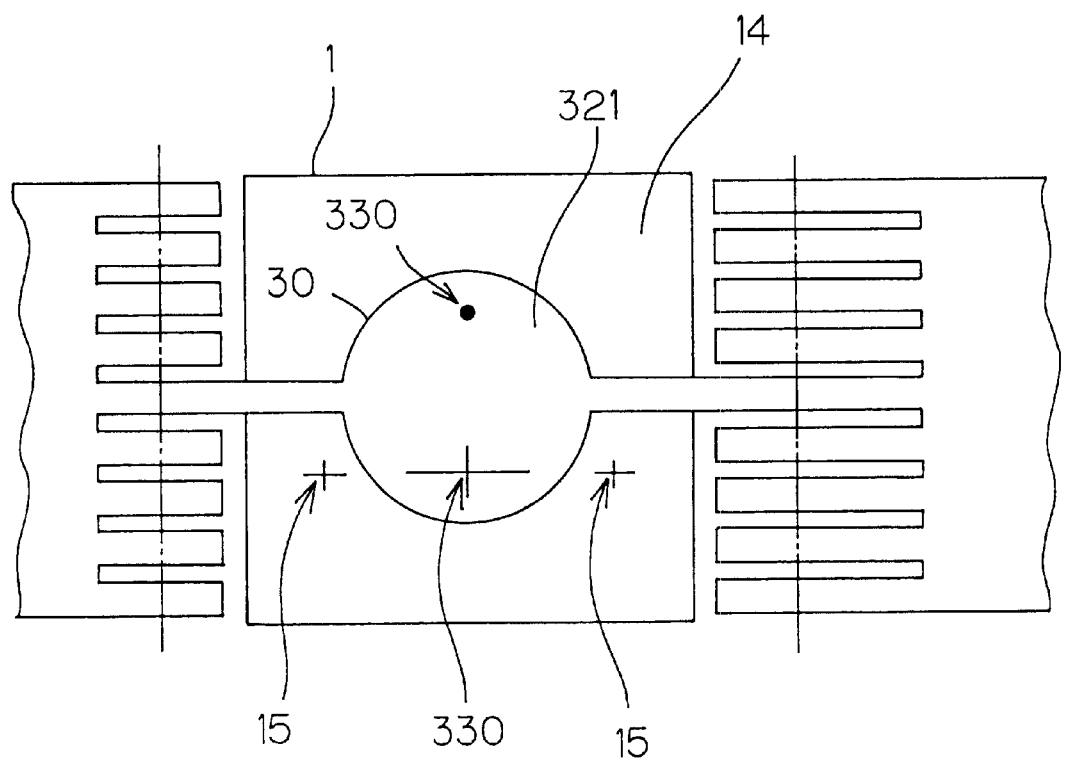
FIG. 12 is a schematic bottom view of the semiconductor device shown in FIG. 11.

FIG. 12 is a schematic bottom view of the semiconductor device of FIG. 11. In this embodiment, back marks 330 are provided on a back face 321 of the lead frame 30. The back marks 330 may have any desired shape, like the back marks on the secondary chip 2 and the primary chip 1. The provision of the back marks 330 on the lead frame 30 offers the following advantages:

(i) Where the lead frame 30 is attached to the primary chip 1, the lead frame 30 can properly be fitted on a predetermined portion of the back face of the primary chip 1 on the basis of the back marks 330 of the lead frame 30 and the back marks 15 on the primary chip 1.

(ii) There is a possibility that the back marks 15 on the back face 14 of the primary chip 1 are hidden by the attached lead frame 30. In such a case, the positioning of the primary chip 1 can be achieved on the basis of the back marks 330 on the lead frame 30, or the positioning of the secondary chip 2 can be achieved on the basis of the back marks 330.

(iii) By attaching the lead frame 30 to the primary chip 1 provided with no back mark, the positioning of the primary chip 1 can be achieved on the basis of the back marks 330 on the lead frame 30, or the positioning of the secondary chip 2 can be achieved on the basis of the back marks 330.

In FIG. 12, comb-shaped portions provided on the right and left sides of the primary chip 1 are cut along one-dot-and-dash lines and later serve as electrodes.

Figure 13:
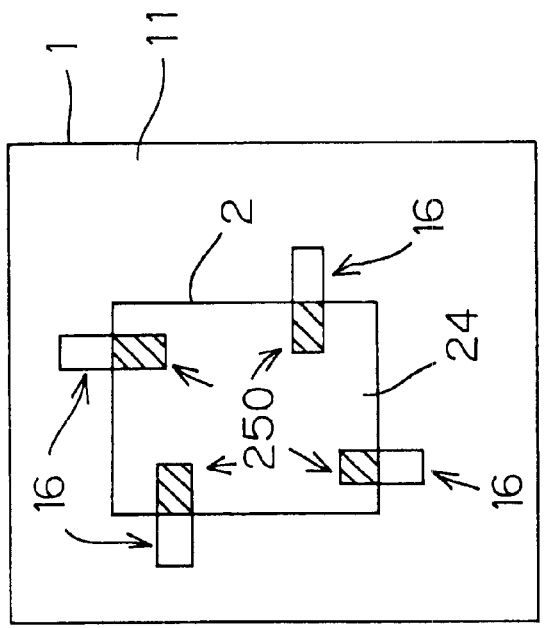
FIGS. 13A to 13C are schematic plan views for explaining back marks according to still another embodiment of the invention.
Figure 13:
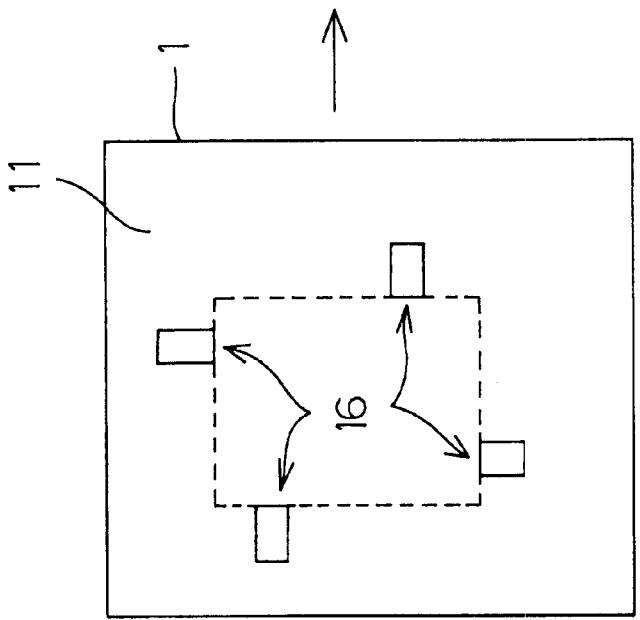
Figure 13:
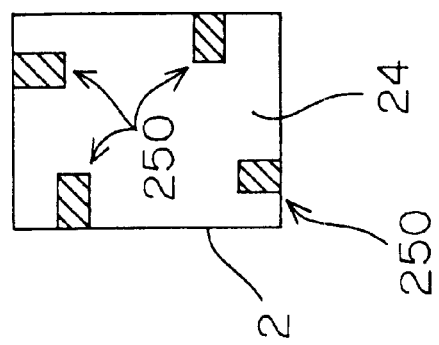

FIGS. 13A to 13C are schematic plan views for explaining back marks according to still another embodiment of the invention. As shown in FIG. 13A, back marks 250 are provided on a back face 24 of a secondary chip 2 as extending from edges of the secondary chip 2. Although the four back marks 250 are illustrated, only one back mark may be provided. On the other hand, front marks 16 are provided on a front face 11 of a primary chip 1 as shown in FIG. 13B. The front marks 16 are provided so as to be brought into a predetermined positional relationship with the back marks 250 on the secondary chip 2. More specifically, the back marks 250 and the front marks 16 form tally marks to be paired with each other as shown in FIG. 13C when the secondary chip 2 is mounted on the primary chip 1. Thus, the primary chip 1 can properly be positioned with respect to the secondary chip 2 when the secondary chip 2 is to be mounted on the primary chip 1.

Since the formation of the marks on the back face 24 of the secondary chip 2 can be achieved without any trouble, the back marks can be provided in any desired positions on the back face 24. On the other hand, an integrated circuit and the like are provided in the front face 11 of the primary chip 1, but covered with a passivation film. Therefore, the front marks 16 can be provided in any desired positions on the passivation film because the front face 11 of the primary chip 1 except for the electrodes is covered with the passivation film. Thus, the tally marks can be provided as described above.

Figure 14:
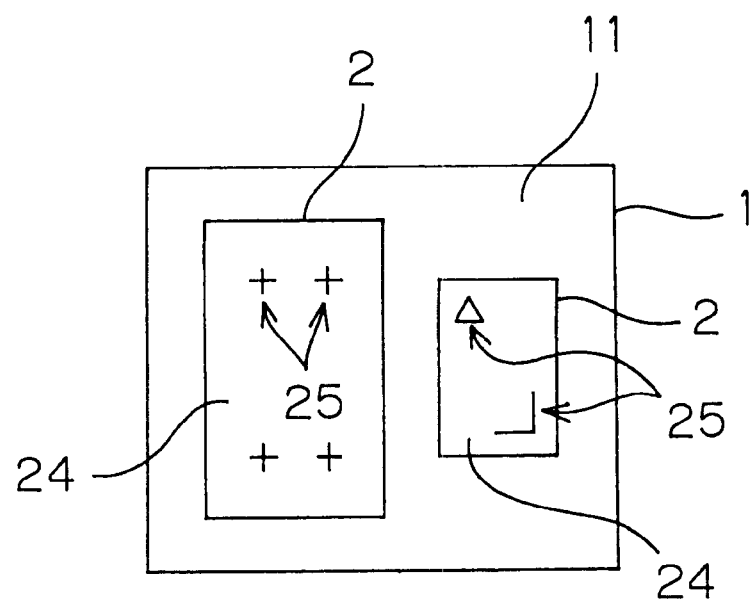
FIGS. 14A to 14C are schematic diagrams illustrating exemplary chip-on-chip structures.
Figure 14:
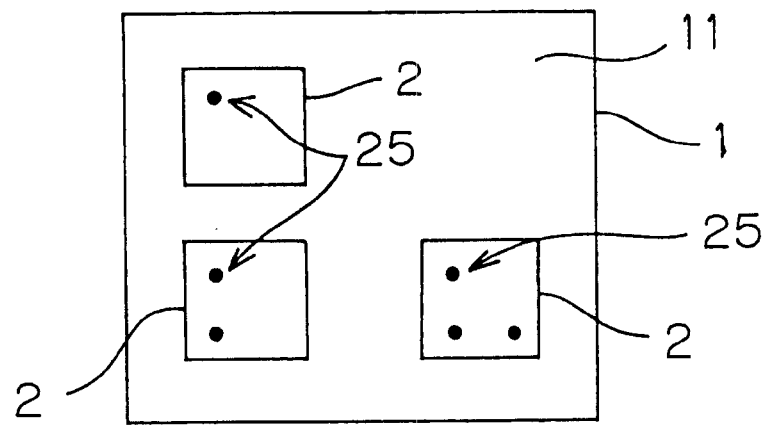
Figure 14:
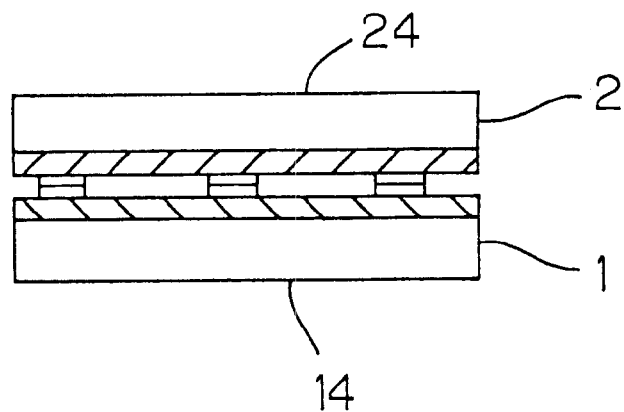

FIGS. 14A to 14C are schematic diagrams illustrating examples of the chip-on-chip structure. The chip-on-chip structure may be such that one secondary chip 2 is mounted on one primary chip 1 as described in the foregoing embodiments, or may be such that two or more secondary chips 2 are mounted on one primary chip 1 as shown in FIGS. 14A and 14B.

Further, the chip-on-chip structure may be such that a primary chip 1 and a secondary chip 2 having substantially the same size are stacked one on the other as shown in FIG. 14C. For production of any of such chip-on-chip structures, the back marks are utilized to properly position the semiconductor chips with respect to each other.

Figure 15:
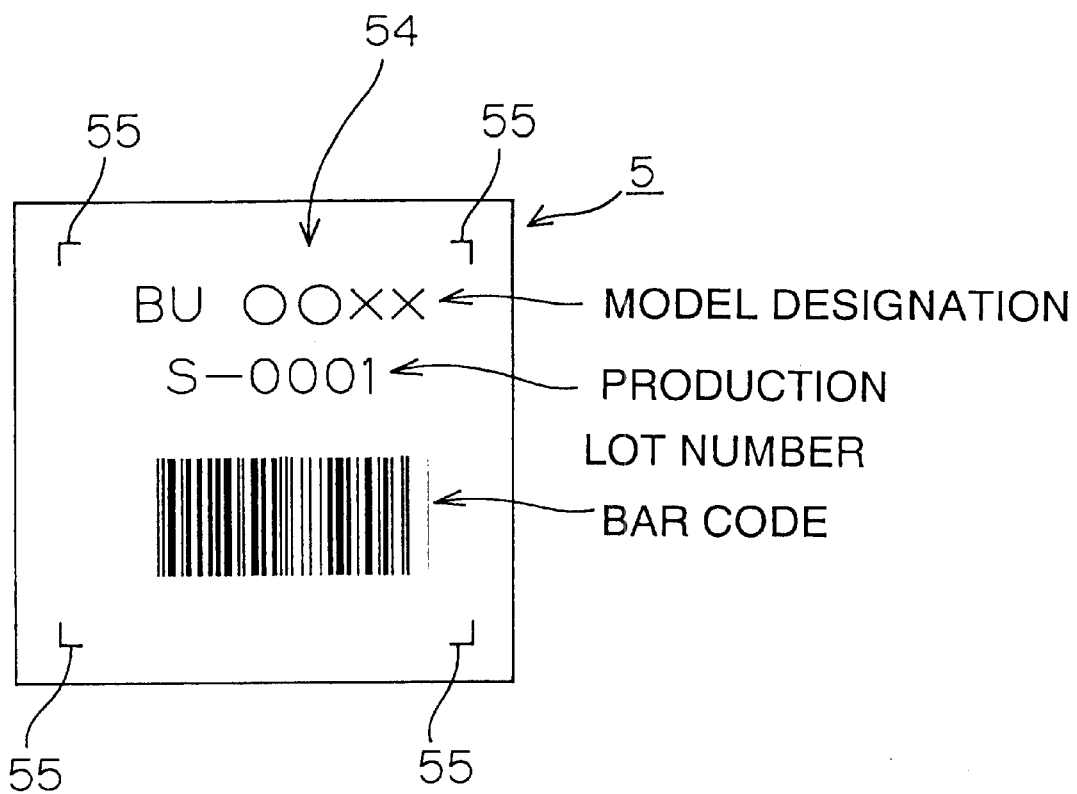
FIG. 15 is a schematic bottom view of a semiconductor chip for chip-on-chip mounting in accordance with further another embodiment of the invention.

FIG. 15 is a schematic bottom view of a semiconductor chip 5 for chip-on-chip mounting in accordance with further another embodiment of the invention. The semiconductor chip 5 for chip-on-chip. mounting is composed of a semiconductor such as silicon, GaAs or Ge. The semiconductor chip 5 has notations, such as the model designation of the semiconductor chip 5 (e.g., "BU 00XX"), the production lot number of the semiconductor chip (e.g., "S-0001"), a bar code indicative of the model designation and the production lot number, and an alignment mark 55, which are provided on a back face 54 of the semiconductor chip 5. This is a feature of this embodiment.

In general, back faces of conventional semiconductor chips are mirror-like surfaces, on which no notation is provided. When a chip-on-chip semiconductor device is assembled by employing such a semiconductor chip, mounting conditions should manually be inputted for each type of semiconductor chips into an assembling apparatus. The manual input of the mounting conditions may lead to erroneous input.

In this embodiment, informational notations specific to the semiconductor chip 5, for example, notations for information on mounting conditions and semiconductor device production and alignment marks 55 for alignment (positioning) of the semiconductor chip for the mounting thereof, are provided on the back face 54 of the semiconductor chip 5. The informational notations specific to the semiconductor chip 5 may be represented by human-readable characters and symbols or by an optically readable bar code or two-dimensional code. The human-readable notations and the optically readable notations may be provided in combination.

The chip-specific informational notations provided on the back face 54 of the semiconductor chip 5 are to be read by a reader of the assembling apparatus when the chip-on-chip structure is assembled by employing the semiconductor chip 5. This obviates the need for the manual input of the mounting conditions, and prevents the erroneous input of the mounting conditions.

In general, plural types of semiconductor chips are incorporated in a chip-on-chip structure. When the semiconductor chips are to be sequentially assembled to form the chip-on-chip structure by means of the assembling apparatus, the plural types of semiconductor chips are identified on the basis of the specific informational notations provided on back faces 54 of the respective semiconductor chips. This eliminates a possibility of mounting a wrong semiconductor chip.

The provision of the specific informational notations on the back face 54 of the semiconductor chip 5 may be achieved by a printing process or a laser process. However, it is more preferable that the specific informational notations are provided on a wafer by using the same material as a bump material when a bump forming process is performed for formation of bumps on the front face of the semiconductor chip 5 before the wafer is diced. Examples of the bump material include Au, Pd, Pt, Ag, Ir (iridium), Ni and Cu, any of which is preferably used for the formation of the specific informational notations on the back face 54 of the semiconductor chip 5. The informational notations formed of the oxidation-resistant metal material same as the bump material can be checked even after a semiconductor device obtained by molding and post-processing the chip-on-chip structure incorporating the semiconductor chip is delivered as a product to the market. That is, the specific informational notations on the back face 54 of the semiconductor chip 5 can be read by removing a mold package from the semiconductor device.

Figure 16A:
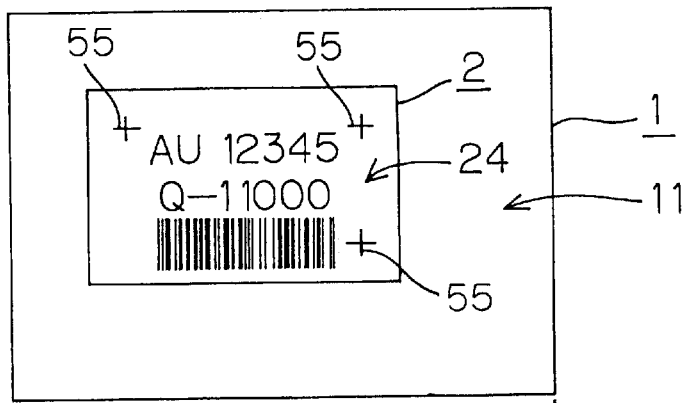
FIGS. 16A to 16C are a plan view, a vertical sectional view and a bottom view, respectively, which schematically illustrate a chip-on-chip semiconductor device according to still another embodiment of the invention.
Figure 16B:
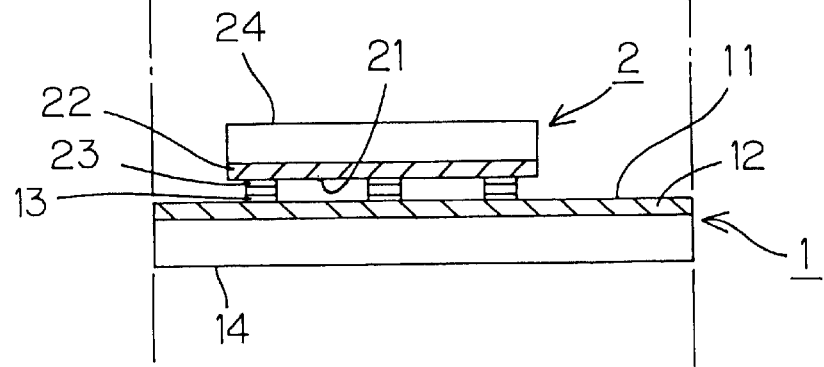
Figure 16C:
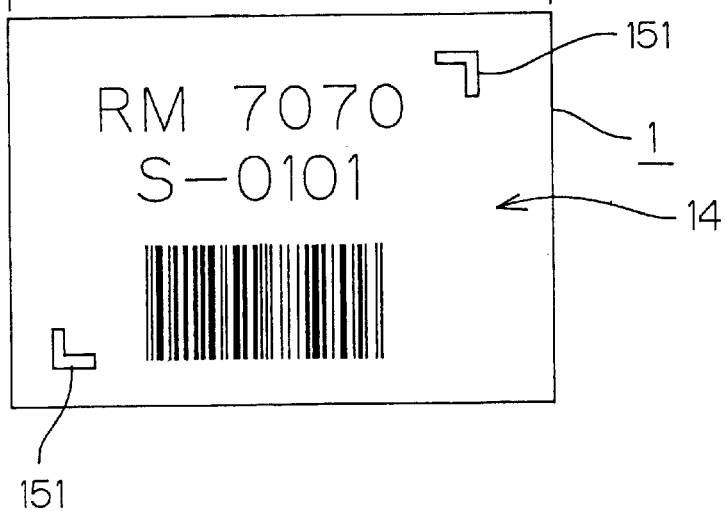

FIGS. 16A, 16B and 16C are a plan view, a vertical sectional view and a bottom view, respectively, which schematically illustrate a chip-on-chip semiconductor device according to still another embodiment of the invention.

As shown in FIG. 16B, the chip-on-chip semiconductor device includes a primary chip 1 and a secondary chip 2 disposed in a double stacked relation. The primary chip 1 and the secondary chip 2 are semiconductor chips such as of silicon, GaAs or Ge. In this embodiment, the primary chip 1 and the secondary chip 2 are each composed of silicon, but the material therefor is not limited thereto. For example, the primary chip 1 and the secondary chip 2 may be composed of silicon and GaAs, respectively, or may be composed of semiconductors in any other combination.

The primary chip 1 is bonded to the secondary chip 2 in a stacked relation with a front face 11 of the primary chip 1 opposed to a front face 21 of the secondary chip 2. The primary chip 1 has an active region 12 provided in the front face 11 thereof, in which an integrated circuit and the like have been formed. Similarly, the secondary chip 2 has an active region 22 provided in the front face 21 thereof, in which an integrated circuit and the like have been formed. The stacked primary and secondary chips 1, 2 are bonded to each other via bumps which respectively connect electrodes 13 provided on the front face 11 to electrodes 23 provided on the front face 21.

For the assembling of the chip-on-chip semiconductor device, the primary chip 1 is placed, for example, with the front face 11 thereof upward, and then the secondary chip 2 is positioned with respect to the primary chip 1 with the front face 21 thereof downward. As shown in FIG. 16A, informational notations specific to the secondary chip 2 are provided on a back face 24 of the secondary chip 2. On the basis of alignment marks 55 of the informational notations, the secondary chip 2 can easily be positioned with respect to the primary chip 1.

As shown in FIG. 16A, the informational notations provided on the back face 24 of the secondary chip 2 include the model designation and production lot number of the secondary chip 2, and a bar code indicative of the model designation and the production lot number, in addition to the alignment marks 55.

Similarly, informational notations including the model number and production lot number of the primary chip 1, a bar code or a two dimensional code indicative of the model number and the production lot number, and alignment marks 151 are provided on a back face 14 of the primary chip 1.

Therefore, information on the respective semiconductor chips incorporated in the chip-on-chip structure of the semiconductor device can easily be checked.

By utilizing the alignment marks 151, 55, the positioning of the secondary chip 2 with respect to the primary chip 1 can easily be achieved, thereby providing the chip-on-chip semiconductor device properly assembled in a desired state.

The aforesaid specific informational notations provided on the back faces of the semiconductor chips are merely illustrative, and any other informational notations may be provided on the back faces. What is important is that the notations provide information on the type of the semiconductor chip, the production process and the like.

The shape of the alignment marks are not limited to "L" (hook- or L-shape), but may be any desired shape such as "·" (point or circle), "+" or "−".

As required, the provision of the alignment marks may be obviated, and the bar code, for example, may be utilized as a positioning reference mark.

Figure 17:
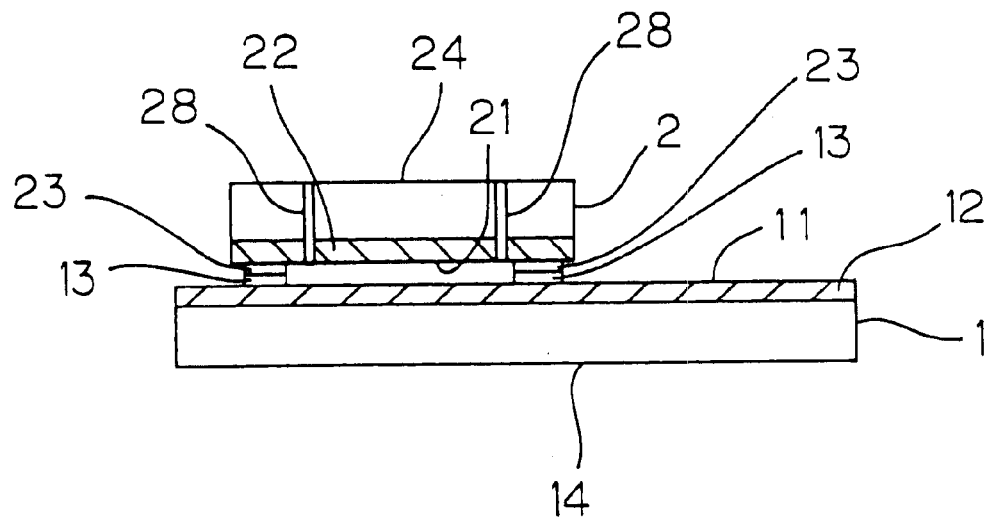
FIG. 17 is a schematic vertical sectional view illustrating the construction of a chip-on-chip semiconductor device according to further another embodiment of the invention.

FIG. 17 is a schematic vertical sectional view illustrating the construction of a chip-on-chip semiconductor device according to further another embodiment of the invention. The chip-on-chip semiconductor device includes a primary chip 1 and a secondary chip 2. The primary chip 1 and the secondary chip 2 are semiconductor chips such as of silicon, gallium arsenide (GaAs) or germanium (Ge). The primary chip 1 and the secondary chip 2 are preferably composed of a semiconductor of the same type, e.g., silicon, but the material therefor is not limited thereto. For example, the primary chip 1 and the secondary chip 2 may be composed of silicon and GaAs, respectively, or may be composed of semiconductors in any other combination.

The primary chip 1 is bonded to the secondary chip 2 in a stacked relation with a front face 11 of the primary chip 1 opposed to a front face 21 of the secondary chip 2. The primary chip 1 has an active region 12 provided in the front face 11 thereof, in which an integrated circuit and the like have been formed. Similarly, the secondary chip 2 has an active region 22 provided in the front face 21 thereof, in which an integrated circuit and the like have been formed. The stacked primary and secondary chips 1, 2 are bonded to each other via bumps which respectively connect electrodes 13 provided on the front face 11 to electrodes 23 provided on the front face 21.

A feature of this embodiment is that positioning pin holes 28 are formed in the secondary chip 2 as extending therethrough from the front face 21 to a back face 24 thereof. As will be described, the positioning pin holes are utilized for recognition of the orientation of the circuit formed in the active region 22 of the secondary chip 2 and the arrangement of the electrodes on the secondary chip 2 from the side of the back face 24 thereof.

In FIG. 17, a reference numeral 14 denotes a back face of the primary chip 1.

Figure 18:
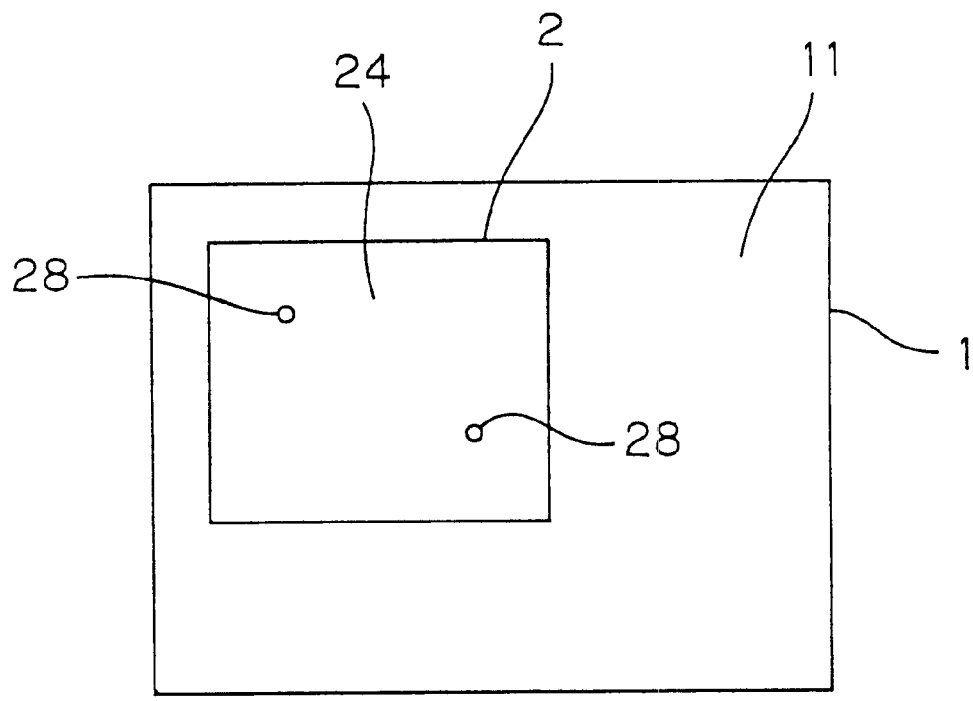
FIG. 18 is a schematic plan view of the chip-on-chip semiconductor device shown in FIG. 17.

FIG. 18 is a schematic plan view of the chip-on-chip semiconductor device. The circuit arrangement, the electrodes and the like are provided on the front face 11 (active region) of the primary chip 1 in a recognizable manner. When the secondary chip 2 is to be mounted in a predetermined position on the front face 11 of the primary chip 1, the primary chip 1 is first positioned, and the circuit arrangement, the electrodes and the like on the front face 11 are detected. The detection may be achieved by capturing an image of the front face 11 of the positioned primary chip 1, for example, by a CCD camera and processing the image. The secondary chip 2 is positioned in the predetermined position on the front face 11 of the primary chip 1 with the front face of the secondary chip 2 facing downward.

However, the type, arrangement and orientation of the electrodes provided on the front face of the secondary chip 2 cannot be recognized from the side of the back face 24 of the secondary chip 2, because the back face 24 of the secondary chip 2 is generally a mirror-like surface. In this embodiment, the positioning of the secondary chip 2 is based on the positioning pin holes 28 formed in the secondary chip 2 as extending therethrough from the front face 21 to the back face 24 thereof as described above.

Figure 19:
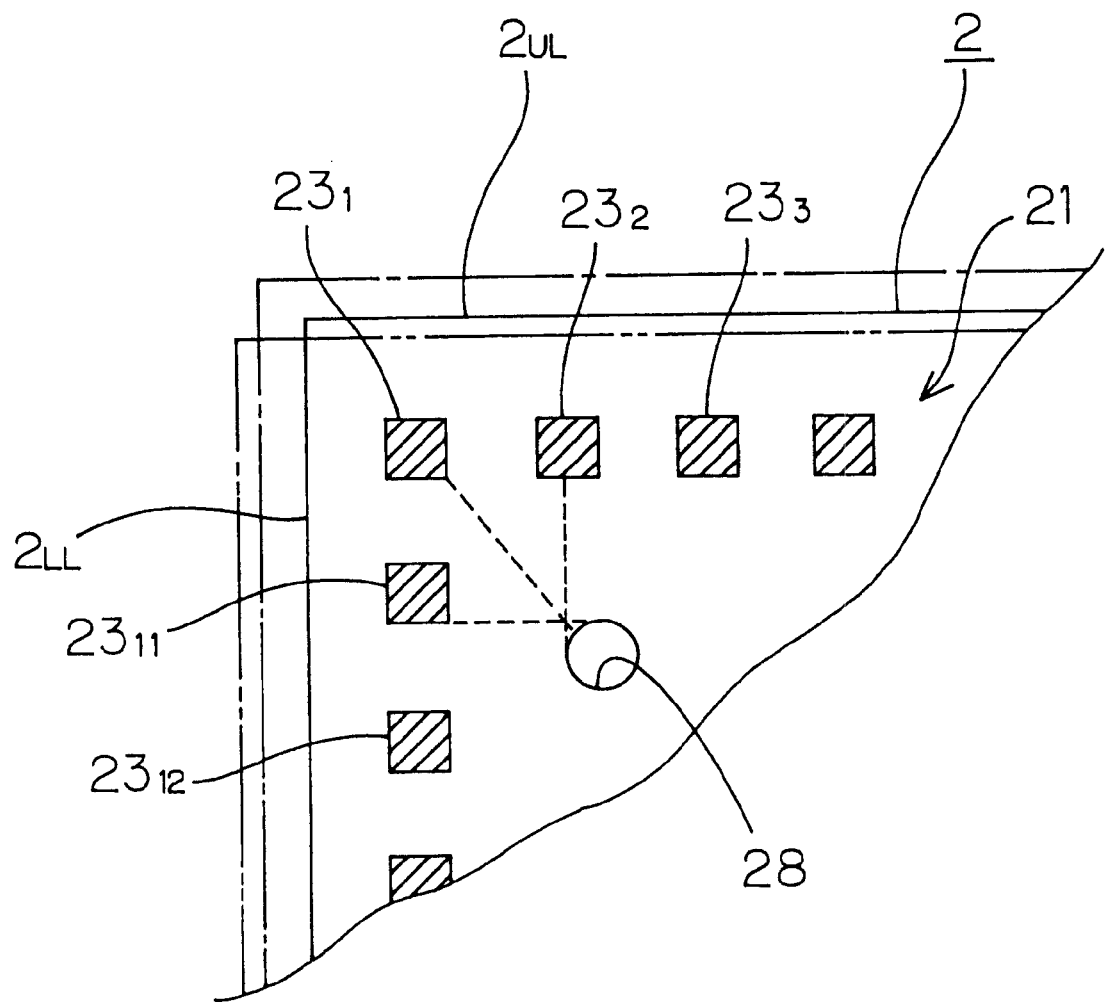
FIG. 19 is a fragmentary enlarged schematic plan view for explaining a positional relationship between electrodes and a positioning pin hole 28 provided on a secondary chip 2 according to still another embodiment of the invention.

A detailed explanation will be given with reference to FIG. 19. FIG. 19 is a fragmentary enlarged schematic plan view illustrating the secondary chip 2 as viewed from the side of the front face 21 thereof. In a left upper corner portion defined by an upper edge $2_{UL}$ and a left edge $2_{LL}$ on the front face 21 of the secondary chip 2, electrodes $23_1$, $23_2$, $23_3$, . . . are provided from the left to the right along the upper edge $2_{UL}$, and electrodes $23_1$, $23_{11}$, $23_{12}$, . . . are provided from the top to the bottom along the left edge $2_{LL}$. In this case, the positions of the upper edge $2_{UL}$ and the left edge $2_{LL}$ vary from chip to chip as indicated by a solid line, a one-dot-and-dash line or a two-dot-and-dash line due to a dicing error.

In this embodiment, the positioning pin hole 28 is formed in a predetermined positional relation with predetermined electrodes, for example, the electrodes $23_1$, $23_2$ and $23_{11}$ in the corner portion. The positioning pin hole 28 extends vertically through the secondary chip 2 from the front face 21 to the back face 24 thereof. By positioning the secondary chip 2 with respect to the positioning pin hole 28, the electrodes 23 having the predetermined positional relationship with the positioning pin hole 28 can be positioned as desired.

The positioning pin hole 28 is formed in a predetermined positional relationship with the plural electrodes $23_1$, $23_2$ and $23_{11}$ as described above, or with a predetermined single electrode. In this case, the positioning pinhole 28 is, of course, formed as extending through a portion of the secondary chip 2 irrelevant to the integrated circuit and the like formed in the secondary chip 2.

The formation of the positioning pin holes 28 may be achieved by means of a drill having a diameter of several tens microns, a high-pressure water drill or a high-power laser beam which is often utilized for processing a printed circuit board or the like, or by an etching process.

The positioning pin holes 28 may be formed in a semiconductor wafer before the wafer is diced, or formed in the secondary chip 2 after the wafer is diced. For efficient processing, the positioning pin holes 28 are preferably formed in the semiconductor wafer.

When the secondary chip 2 is to be mounted on the primary chip 1, the secondary chip 2 is positioned with respect to the primary chip 1 on the basis of the positioning pin hole 28 which can be seen from the side of the back face 24 of the secondary chip 2, and then bonded to the primary chip.

The positions and number of the positioning pin holes 28 formed in the semiconductor chip 2 described above are merely illustrative, and what is important is that the secondary chip 2 is formed with the positioning pin hole 28 which is utilized for positioning the secondary chip with respect to the primary chip when the secondary chip 2 as a second chip is to be mounted on the primary chip 1 as a first chip for formation of the chip-on-chip structure.

It should be understood that the present invention is not limited to the embodiments described above but various modifications may be made within the spirit and scope of the invention as defined by the appended claims.

What is claimed is:

1. A semiconductor chip for a chip-on-chip structure comprising:
   a plurality of semiconductor chips bonded to one another in a face-to-face stacked relation,
   wherein one of the plurality of semiconductor chips is a primary chip to be disposed with a front face thereof upward,
   wherein another of the plurality of semiconductor chips is a secondary chip to be bonded onto the primary chip with a front face thereof facing downward as opposed to the front face of the primary chip, and
   wherein the primary chip is provided with a back mark, on a back face thereof, for recognition of orientation and electrode arrangement.

2. The semiconductor chip for a chip-on-chip structure according to claim 1, wherein the second chip has a back face and at least one of the primary and secondary chips has an informational notation on the back face of the at least one of the primary and secondary chips.

3. The semiconductor chip for a chip-on-chip structure according to claim 2, wherein the informational notation is model designation.

4. The semiconductor chip for a chip-on-chip structure according to claim 2, wherein the informational notation is a product lot number.

5. The semiconductor chip for a chip-on-chip structure according to claim 1, wherein the second chip has a back face and at least one of the primary and secondary chips has a bar code indicative of the informational notation on the back face of the at least one of the primary and secondary chips.

6. The semiconductor chip for a chip-on-chip structure according to claim 5, wherein the informational notation is indicative of at least one of model designation, a product lot number, and an alignment mark.

7. A semiconductor chip for a chip-on-chip structure a plurality of semiconductor chips bonded to one another in a face-to-face stacked relation,
- wherein one of the plurality of semiconductor chips is a primary chip to be disposed with a front face thereof upward,
- wherein another of the plurality of semiconductor chips is a secondary chip to be bonded onto the primary chip with the front face thereof facing downward as opposed to the front face of the primary chip, and
- wherein each of the primary chip and the secondary chip is provided with a back mark, on a back face thereof, for recognition of orientation and electrode arrangement.

8. A semiconductor chip for a chip-on-chip structure according to claim 7, wherein the secondary chip has a back face and at least one of the primary and secondary chips has an informational notation on the back face of the at least one of the primary and secondary chips.

9. The semiconductor chip for a chip-on-chip structure according to claim 8, wherein the informational notation is model designation.

10. The semiconductor chip for a chip-on-chip structure according to claim 8, wherein the informational notation is a product lot number.

11. The semiconductor chip for a chip-on-chip structure according to claim 7, wherein the second chip has a back face and at least one of the primary and secondary chips has a bar code indicative of a informational notation on the back face of the one of the primary and secondary chips.

12. The semiconductor chip for a chip-on-chip structure according to claim 11, wherein the informational notation is indicative of at least one of model designation, a product lot number, and an alignment mark.

13. A semiconductor chip for a chip-on-chip structure comprising:
- a plurality of semiconductor chips bonded to one another in a face-to-face stacked relation,
- wherein a lead frame is fitted on a back face of the primary chip, and a back mark for recognition of orientation and electrode arrangement is provided in a predetermined position on the lead frame on the back face of the primary chip.

* * * * *